(12) United States Patent
Lazarovich et al.

(10) Patent No.: US 6,685,803 B2
(45) Date of Patent: Feb. 3, 2004

(54) PLASMA TREATMENT OF PROCESSING GASES

(75) Inventors: Stela Diamant Lazarovich, Palo Alto, CA (US); Avner Rosenberg, Beit Shearim (IL); Joseph Shiloh, Haifa (IL); Joseph Statlender, Haifa (IL); Elhanan Wurzberg, Kiriat Motzkin (IL)

(73) Assignee: Applied Materials, Inc., Santa Clara, CA (US)

( * ) Notice: Subject to any disclaimer, the term of this patent is extended or adjusted under 35 U.S.C. 154(b) by 282 days.

(21) Appl. No.: 09/888,191

(22) Filed: Jun. 22, 2001

(65) Prior Publication Data

US 2003/0007910 A1 Jan. 9, 2003

(51) Int. Cl.$^7$ .............................................. B01J 19/08
(52) U.S. Cl. .................................................. 204/164
(58) Field of Search ..................... 204/164; 422/186.04, 422/186.07

(56) References Cited

U.S. PATENT DOCUMENTS

| | | | |
|---|---|---|---|
| 3,627,663 A | 12/1971 | Davidse et al. | 204/192 |
| 5,061,462 A | 10/1991 | Suzuki | 422/186.04 |
| 5,146,137 A | 9/1992 | Gesche et al. | 315/111.21 |
| 5,194,291 A | 3/1993 | D'Aoust et al. | 148/276 |
| 5,387,775 A | 2/1995 | Kang | 219/121.52 |
| 5,427,747 A | 6/1995 | Kong et al. | 422/186 |
| 5,458,856 A | 10/1995 | Marie et al. | 422/186 |
| 5,467,722 A | 11/1995 | Meratla | 110/345 |
| 5,478,532 A | 12/1995 | Uhm | 422/186 |
| 5,490,973 A | 2/1996 | Grothaus et al. | 422/186.04 |
| 5,582,632 A | 12/1996 | Nohr et al. | 95/78 |
| 6,007,785 A | 12/1999 | Liou | 422/186.07 |
| 6,083,355 A | 7/2000 | Spence | 204/164 |
| 6,119,455 A | 9/2000 | Hammer et al. | 60/301 |
| 6,146,599 A | 11/2000 | Ruan et al. | 422/186.04 |
| 6,245,299 B1 | 6/2001 | Shiloh et al. | 422/121 |

FOREIGN PATENT DOCUMENTS

| | | |
|---|---|---|
| DE | 4231581 A1 | 3/1994 |
| EP | 0785016 A1 | 7/1997 |
| JP | HEI-6-292817 | 10/1994 |
| WO | WO 95/31270 | 11/1995 |
| WO | WO 99/26726 | 6/1999 |

OTHER PUBLICATIONS

Vartanian et al., *Long–Term Evaluation of the Litmas "Blue" Plasma Device for Point–of–Use (POU) Perfluorocompound and Hydroflourocarbon Abatement*, Technology Transfer # 99123865 A–ENG, International SEMATECH, Austin, Texas, pp. 1–50, Jan. 7, 2000.

Zoran Falkenstein "Processing of $C_3H_7OH$, $C_2HCl_3$ and $CCl_4$ in Flue Gases Using Silent Discharge Plasmas (SDPs), Enhanced by (v)UV at 172 nm and 253.7 nm", J. Adv. Oxid. Technol. vol. 2, No. 1, pp. 223–238, Los Alamos, New Mexico, 1997, no date available.

*Primary Examiner*—Kishor Mayekar
(74) *Attorney, Agent, or Firm*—Albert J. Dalhuisen

(57) ABSTRACT

The present invention provides a DBD cell (500) including ring shaped electrodes (512 and 514) that are positioned side-by-side on a dielectric tube (516). An AC power supply (518) is provided such that the cell and the power supply form a DBD treatment device (540) for abatement of noxious gases for example FCs that can be discharged from semiconductor fabricating devices. Additionally, one or more sensors (822) and/or one or more gas addition ports (816) can be included in a DBD cell (800) of the present invention. Several DBD cells (1030, 1036 and 1042) of the present invention can be combined to form a DBD reactor (1010) of the present invention. AC power supplies (1012, 1014 and 1016) are utilized to energize the cells (1030, 1036 and 1042).

26 Claims, 11 Drawing Sheets

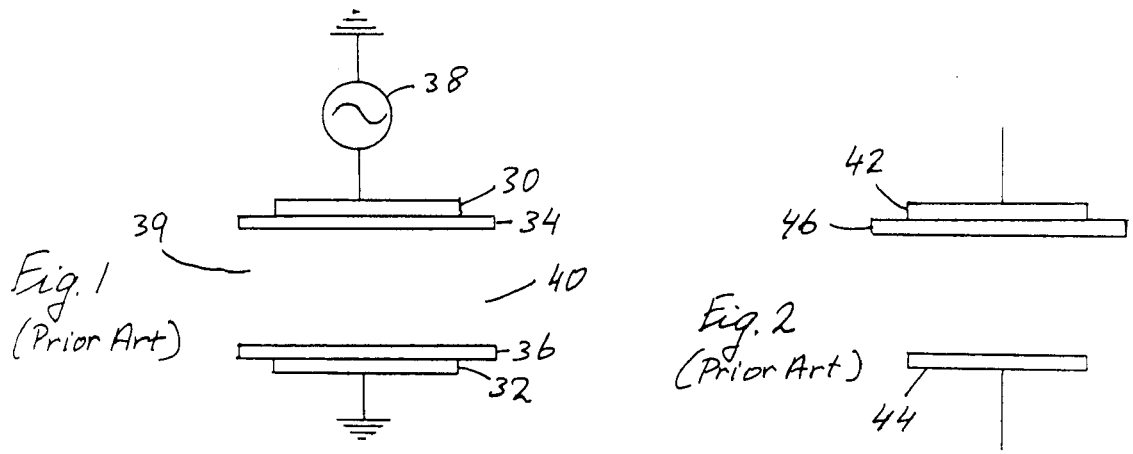
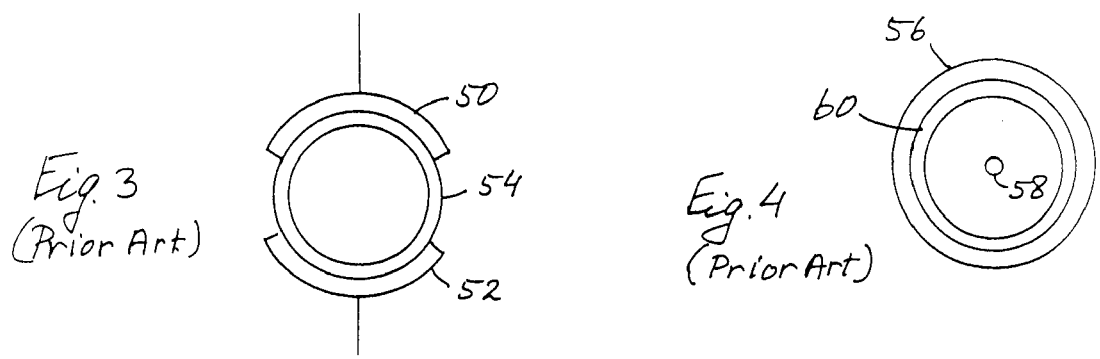
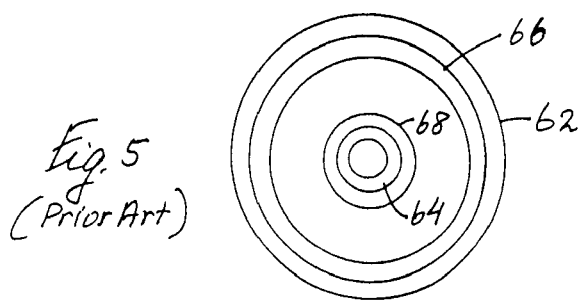

PLASMA TREATMENT OF PROCESSING GASES

FIELD OF THE INVENTION

The present invention relates to methods and devices for dielectric barrier discharge plasma treatment of processing gases.

BACKGROUND OF THE INVENTION

Semiconductor fabrication techniques employ a variety of gases for such processes as thin film deposition, etching, surface preparation and chamber cleaning. Additionally, gases can be formed as by-products of these fabrication techniques. Many process and by-product gases are toxic, corrosive or combustible. Consequently, semiconductor fabrication techniques typically require treatment of effluent gases to remove noxious substances. Conventional treatment techniques include wet and dry scrubbing, and treatment in an oxidizing or reducing environment usually followed by wet or dry scrubbing. Fluorine-containing compounds are present in many semiconductor processing effluent gases. Conventional abatement techniques for fluorine gases include incineration of these gases followed by wet or dry scrubbing. It is well known to those of ordinary skill in the art that these incineration techniques are inefficient and result in generating much waste heat.

Also, it is known to use thermal and non-thermal plasmas for treating hazardous gases, such as fluorine-containing compounds, in order to convert these gases to environmentally safe products, see for example PCT International Application Publication WO 99/26726. In this publication, Shiloh et al. disclose the use of DBD (dielectric barrier discharge) non-thermal plasmas for pollution abatement. DBD technology employs DBD cells each having two electrodes, wherein one or both electrodes of each cell is provided with an insulator. Each DBD cell is energized by means of a high frequency alternating current electrical power supply. The high frequency energy is discharged capacitatively through the insulator, forming a plasma discharge between the electrodes. Shiloh et al. disclose a variety of DBD cell configurations, exemplified herein as FIGS. 1 through 5. As schematically illustrated in FIG. 1, an illustrative DBD cell includes electrically conductive electrodes 30 and 32. Insulator dielectric layers 34 and 36 are provided to electrodes 30 and 32 respectively, such that the dielectric layers are interposed between the electrodes. Suitable dielectric materials include alumina and quartz. A high frequency electrical power supply 38 is connected to electrodes 30 and 32.

A gas stream is caused to flow between dielectric layers 34 and 36 of the DBD cell depicted in FIG. 1, entering for example at gas inlet 39 and exiting at gas outlet 40. High frequency power supply 38 is activated, forming a plasma discharge between electrodes 30 and 32 wherein the energy is capacitatively discharged through dielectric layers 34 and 36. The plasma activates the gas molecules causing dissociation, ionization or free radical formation which is utilized to for example convert noxious gaseous compounds into environmentally friendly compounds or into compounds which can be more easily removed through the use of conventional scrubber technology. Also, a reactive gas such as oxygen or hydrogen can be introduced into the cell, for example at gas inlet 39, to react with compounds in the plasma environment. Cells, such as the cell shown in FIG. 1, can be utilized in series by causing the gas stream to flow through two or more consecutive cells to provide a more effective gas treatment system.

Alternative DBD cell configurations are illustrated in FIGS. 2–5. The cell depicted in FIG. 2 includes electrically conductive electrodes 42 and 44. A dielectric layer 46 is provided to electrode 42 such that layer 46 is interposed between the electrodes. FIG. 3 illustrates a cell having curved electrodes 50 and 52 that are positioned on opposite sides on the outside of a dielectric tube 54. The cell shown in FIG. 4 includes a cylindrical electrode 56 and a conductive wire electrode 58. A dielectric layer 60 is provided to the inside of cylindrical electrode 56. The cell illustrated in FIG. 5 includes concentric cylinder-shaped electrodes 62 and 64. Dielectric layers 66 and 68 are provided to the inside of electrode 62 and to the outside of electrode 64 respectively. A plasma is generated by the electrodes of the cells shown in FIGS. 2–5 employing a technology similar to that described in connection with FIG. 1.

Within each of the prior art cells shown in FIGS. 1–5, the electrodes are placed in opposing positions. At least one of the electrodes of each cell is provided with a dielectric layer facing the opposing electrode. The electrodes and the dielectric layer(s) are positioned substantially parallel to the gas stream.

Shiloh et al. disclose high frequency power supplies for use with cells such as those exemplified in FIGS. 1–5, and control techniques wherein sensors indicating for example gas composition or temperature can be employed to monitor or control the DBD abatement process.

It is also known to use a RF (radio frequency) plasma source for fluorocarbon abatement of semiconductor fabrication processes, see for example Vartanian et al., *Long-Term Evaluation of the Litmas "Blue" Plasma Device for Point-of-Use (POU) Perfluorocompound and Hydrofluorocarbon Abatement*, Technology Transfer# 99123865A-ENG, International SEMATECH, pp. 1–50, Jan. 7, 2000. The device disclosed by Vartanian et al. includes a dielectric tube, such as alumina, surrounded by RF excitation coils. A variable frequency power supply is employed for generating a high density RF plasma that is contained inside the dielectric tube.

Gas mixtures that are discharged from semiconductor processing or fabricating devices or equipment, such as etch chambers, can rapidly change in flow rate and pressure. For example, pressure variations from 100 mTorr up to about 1500 mTorr and gas flow rate variations from tens to hundreds sccm (standard cubic centimeters per minute) can occur within seconds and can be repeated every few minutes. Conventional abatement techniques have generally tried to meet the need for responding to these rapid changes by operating the abatement technique such that it will provide satisfactory abatement under the anticipated highest levels and amounts of noxious compounds, generally resulting in wasted resources and development of waste heat due to unnecessary high treatment levels when relatively low levels of noxious compounds are present.

The abatement methods and devices disclosed by Shiloh et al. in publication WO 99/26726 were found to be quite effective. However, experience with these methods and devices showed the need for improvements. The needed improvements include improved efficiency, reduced heat development, improved gas flow through the cell and reduced operating costs, as well as improved integration with semiconductor fabricating devices or tools and pump systems.

The abatement methods and devices disclosed by Vartanian et al. utilize RF plasma technology. Compared with DBD technology, RF technology generates more waste heat. Also, the higher operating temperature of RF systems is more likely to introduce thermally caused stresses in the dielectric tube than is likely to occur in DBD systems.

SUMMARY OF THE INVENTION

The present invention provides novel devices, techniques and processes for plasma treatment of processing gases that overcome the prior art problems described above.

In one embodiment of the present invention a DBD cell is provided wherein a pair of ring shaped electrodes are positioned side-by-side on a dielectric tube.

In another embodiment of the present invention a DBD cell having ring shaped electrodes that are positioned side-by-side on a dielectric tube, is provided with one or more sensors for determining temperature or chemical composition of a gas present in the cell.

In another embodiment of the present invention a DBD reactor including several DBD cells is provided. Each of the cells includes a pair of ring shaped electrodes that are positioned side-by-side on the same dielectric tube.

In another embodiment of the present invention a DBD treatment device is provided including a DBD cell having ring shaped electrodes that are positioned side-by-side on a dielectric tube. Additionally, an AC power supply is provided for energizing the DBD cell. Noxious gas abatement methods are also provided.

In another embodiment of the present invention a DBD treatment device is provided including a DBD reactor having several DBD cells. Each of the cells includes a pair of ring shaped electrodes that are positioned side-by-side on the same dielectric tube. Additionally, an AC power supply is provided for each of the cells. Furthermore, at least one sensor and controller are provided for measuring the composition or temperature inside the tube and for automatically adjusting the power supply for meeting pre-defined gas processing conditions. Gas abatement methods are also provided.

In another embodiment of the present invention a semi-conductor processing system is provided including a DBD cell having ring-shaped electrodes that are positioned side-by-side on a dielectric tube. Additionally, an AC power supply is provided for energizing the cell. The cell is operably connected to the gas discharge system of a semi-conductor fabricating device. Gas abatement methods for treating gas discharged from the fabricating system are also provided, including the use of controllers to integrate operation of the cell with the operation of the fabricating device.

In another embodiment of the present invention a pump integrated DBD treatment apparatus is formed. The apparatus includes novel DBD cells or DBD treatment devices each having at least one pair of ring shaped electrodes that are positioned side-by-side on the same dielectric tube. These DBD cells or treatment devices are integrated with vacuum pump stages.

In another embodiment of the present invention DBD devices having one or more DBD cells, each including a pair of ring shaped electrodes that are positioned side-by-side on the same dielectric tube, are utilized to form fluorine species for use in chemical processing methods, techniques and devices including wafer fabricating devices.

BRIEF DESCRIPTION OF THE DRAWINGS

FIG. 1 is a schematic axial cross section view illustrating a prior art DBD cell.

FIG. 2 is a schematic axial cross section view illustrating another prior art DBD cell.

FIG. 3 is a schematic cross section view illustrating yet another prior art DBD cell.

FIG. 4 is a schematic cross section view illustrating still another prior art DBD cell.

FIG. 5 is a schematic cross section view illustrating another prior art DBD cell.

DETAILED DESCRIPTION OF THE INVENTION

While describing the invention and its embodiments, certain terminology will be utilized for the sake of clarity. It is intended that such terminology include the recited embodiments as well as all equivalents.

Figure 6:
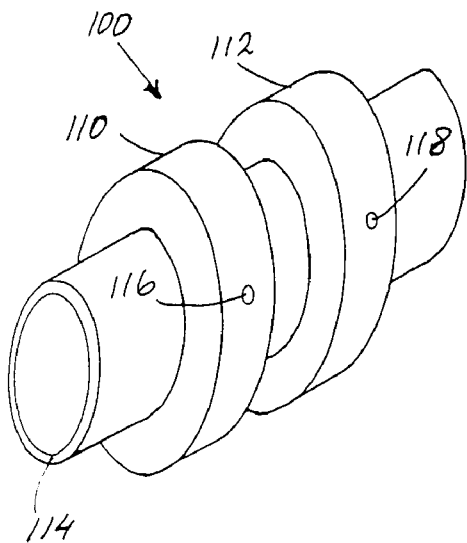
FIG. 6 is a schematic perspective view illustrating a DBD cell of the present invention.
Figure 7:
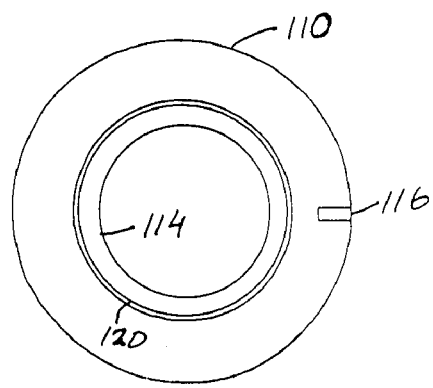
FIG. 7 is a schematic cross section view of one of the electrodes of the DBD cell illustrated in FIG. 6.
Figure 8:
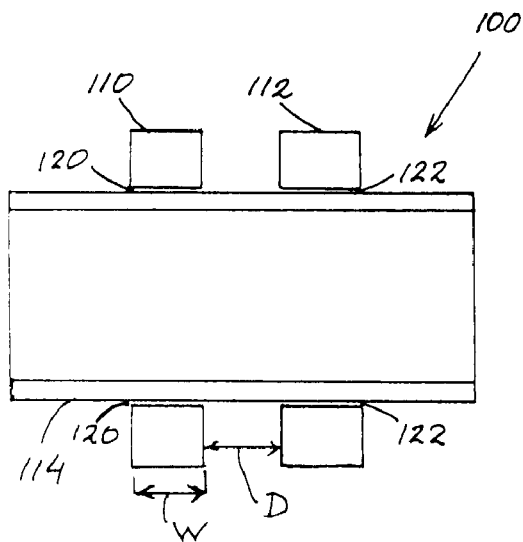
FIG. 8 is a schematic axial cross section view showing the DBD cell illustrated in FIG. 6.

One embodiment of the invention, schematically illustrated in FIGS. 6 and 8, shows a novel DBD (dielectric barrier discharge) cell 100 including ring shaped electrodes 110 and 112, and a substantially cylindrical dielectric tube 114. Electrodes 110 and 112 preferably include electrical contact formations 116 and 118 respectively for receiving an electrical connector. Examples of suitable electrical contact formations includes female plugs, male plugs, threaded connections and fasteners, clamping surfaces, and solder, welding or brazing surfaces. A schematic cross section view of electrode 110 and dielectric tube 114 is shown in FIG. 7.

Dielectric tube 114, shown in FIGS. 6–8, is made of a dielectric material such as alumina, quartz or sapphire. An example of a suitable dielectric material includes non porous vacuum tight alumina having a density of about 3.85 g/ml. Electrodes 110 and 112 are made of an electrically conductive material including metals such as aluminum, copper and stainless steel. These electrodes have a ring or cylindrical band shape, see for example electrode 110 shown in FIG. 7. Electrodes of DBD cells of the present invention encircle the dielectric tube on which they are mounted in a side-by-side position. Preferably, the distance between electrodes 110 and 112 is the shortest distance D (see FIG. 8) which does not result in arcing between these electrodes when the electrodes are activated by a suitable power supply. Typically, distance D ranges from about 10 mm to about 30 mm. A preferred distance D is about 15 mm. Distance D is defined as the distance between the opposing surfaces of the electrodes of a DBD cell. Width W of electrode 110, see FIG. 8, typically ranges from about 20 mm to about 40 mm. A preferred width is 27 mm.

Typically, electrodes 110 and 112 are slidably fitted on tube 114, preferably providing a slight gap 120 and 122, see FIGS. 7 and 8, between the outside of tube 114 and the inside of electrodes 110 and 112 respectively. This gap allows for differences in thermal expansion or contraction between the tube and the electrodes. Preferably, the gap between the tube and electrode is filled with a sealing paste to substantially exclude air from the gap between the electrode and the tube since an air gap can result in reduced plasma efficiency or sparking of the electrode due to a coupling capacitance that is too low in the air gap. The gap between the inside of the electrode and the outside of the dielectric tube should be as narrow as possible while still allowing for differences in thermal expansion or contraction between the tube and the electrode. Preferably, the gap should be narrower than 1 mm. Suitable gap sealing pastes include electrically insulating silicone based and polytetrafluoroethylene based pastes, such as FOMBLIN® grease RT-15 available from Ausimont located in Morristown, N.J. Grease RT-15 includes a mixture of perfluoropolyethers and polytetrafluoroethylene.

Figure 10:
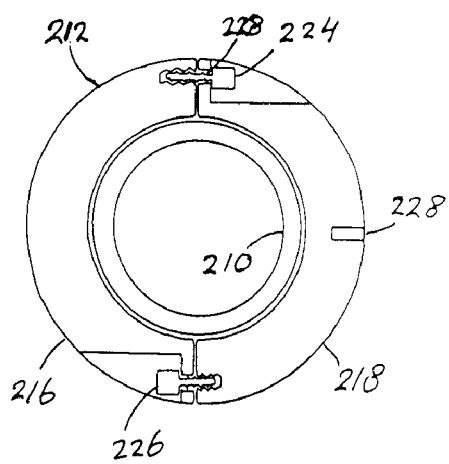
FIG. 10 is a schematic cross sectional view showing one of the electrodes of the cell illustrated in FIG. 9.
Figure 9:
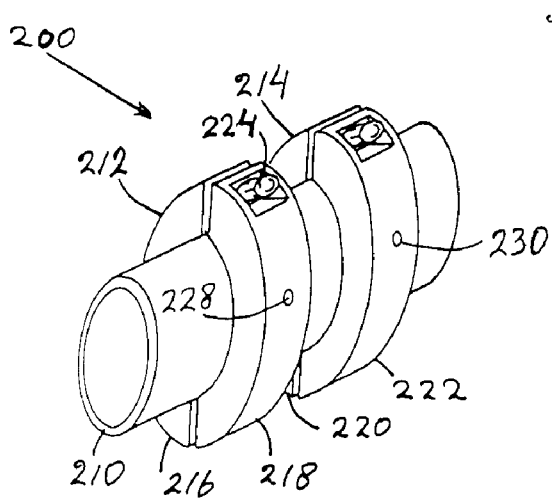
FIG. 9 is a schematic perspective view illustrating another DBD cell of the present invention.

An alternative embodiment of the present invention is schematically depicted in FIG. 9, showing a novel DBD cell 200 including a dielectric tube 210 and novel DBD electrodes 212 and 214 encircling tube 210. Electrodes 212 and 214 are positioned side-by-side. Each of these cells includes two electrically conductive segments, each having a half ring shape. Electrode 212 includes segments 216 and 218 as depicted in FIGS. 9 and 10. Similarly, electrode 214 includes half ring segments 220 and 222. The two segments of each electrode are removable fastened to each other using fasteners, for example bolts, such as bolts 224 and 226 of electrode 212 shown in FIGS. 9 and 10. Bolt 224 extends through a hole 228 in segment 218. This bolt is threadably fastened to segment 216. Similarly bolt 226 is threadably fastened to segment 218. The two electrode segments, when fastened together, form a ring or cylindrical band shaped single electrode encircling dielectric tube 210. Preferably, at least one bolt of each pair of bolts used in the assembly of each electrode, is made of metal in order to form a high conductivity electrical connection between the two segments of each electrode.

Electrodes 212 and 214 are preferably provided with electrical contact formations 228 and 230 respectively (see FIG. 9), similar to the corresponding contact formations of DBD cell 100 depicted in FIG. 6. Preferably, a slight gap is provided between the inside of electrodes 212 and 214, and the outside of dielectric tube 210 of novel DBD cell 200. These gaps are similar to gaps 120 and 122 of electrodes 110 and 120 respectively of novel DBD cell 100, as shown in FIGS. 7 and 8.

Preferably, novel electrode segments such as those described in connection with novel DBD cell 200, shown in FIGS. 9 and 10, employ a biasing element, such as a spring, in conjunction with each fastener in order to urge the electrode segments together in a spring-like manner. For example, a biasing element, such as a compression spring (not shown) or one or more washers (not shown) including lock washers providing a compression spring bias, can be employed in conjunction with bolts 224 and 226, (FIG. 10) in order to urge electrode segments 216 and 218 together to form electrode 212, using techniques and devices that are well known to those of ordinary skill in the art.

Figure 11:
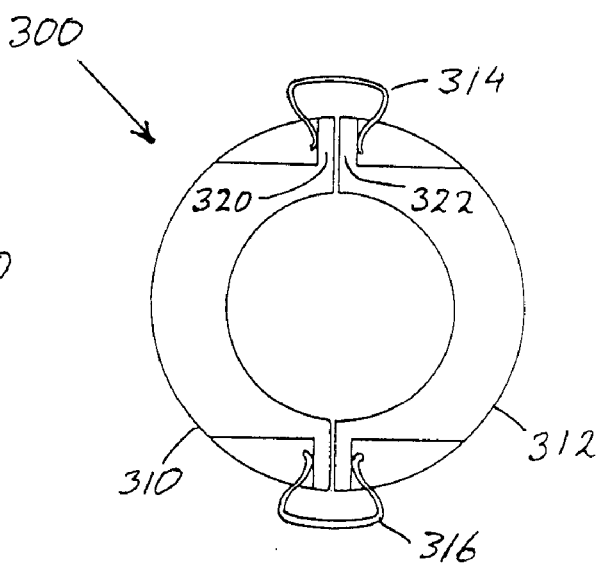
FIG. 11 is a schematic cross sectional view showing another DBD cell of the present invention.
Figure 12:
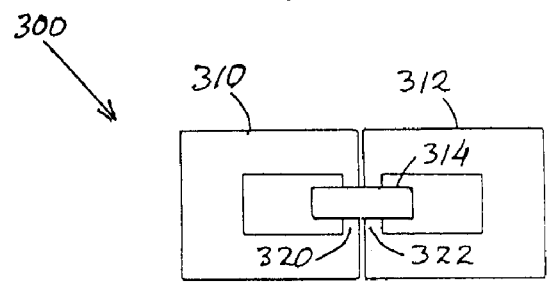
FIG. 12 is a schematic plan view of the cell illustrated in FIG. 11.

As depicted in FIGS. 9 and 10, electrodes can be formed by attaching two electrode segments to each other by means of bolts. However, it is also contemplated to employ other attachment means such as exemplified in FIG. 11, showing a schematic cross sectional view of novel DBD electrode 300 including electrode segments 310 and 312. Clamps 314 and 316 of electrode 300 are the fasteners for attaching electrode segment 310 to segment 312. Clamp 314 provides a clamping force to portions 320 and 322 of segments 310 and 312 respectively, see FIG. 12 depicting a plan view of electrode 300. A similar clamping force is provided by clamp 316. Suitable clamps include clamps commonly referred to as C-clamps, as well as clamps providing a spring action in addition to a clamping force, such that the spring action urges the electrode segments together. A spring action clamp thus provides a biasing element as well as a fastener. Preferably at least one of the clamps of each DBD electrode is made of metal in order to form a high conductivity electrical connection between the two segments of the electrode.

Figure 13:
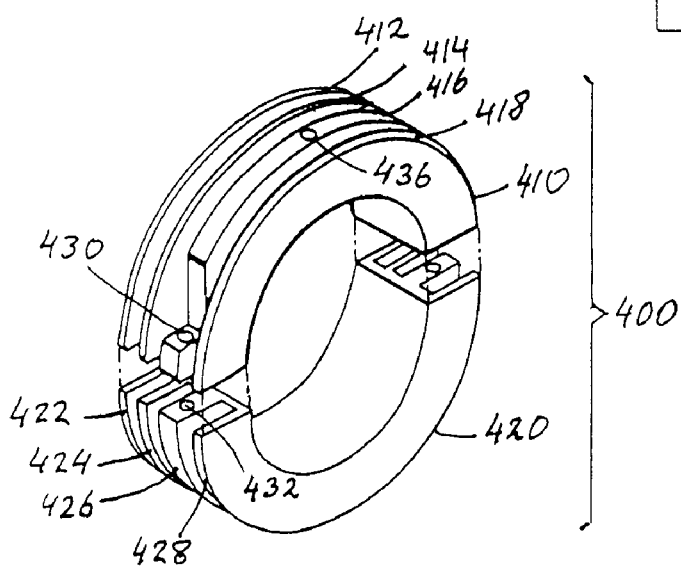
FIG. 13 is a schematic exploded perspective view showing another DBD electrode of the present invention.

Additionally, it is preferable to provide one or more heat sinks to each DBD electrode, or to its DBD electrode segments as schematically illustrated in connection with novel DBD electrode 400 shown in FIG. 13. Electrode segment 410 includes heat sink elements 412, 414, 416 and 418 extending radially. Similarly, electrode segment 420 includes heat sink elements 422 and 424, 426 and 428. Preferably, the heat sink elements are integral with the segment. Alternatively, the heat sink elements can be separate components that are attached to the electrode segment. Preferably, the heat sinks are made from highly heat conductive materials, such as metals. These heat sinks are utilized to dissipate heat from the dielectric tube and the DBD electrode, typically by exposure to cooling air. Holes 430 and 432 (FIG. 13) are provided to bolt (not shown) the cell segments together, similar to the techniques described in connection with novel DBD electrode 212 depicted in FIGS. 9 and 10. The configuration of electrode 400 was empirically found to be a preferred configuration for optimized abatement. The improvements that are realized with configurations such as exemplified in electrode 400 are believed to be due to what is known as a "hollow cathode effect", wherein plasma density is enhanced inside a hollow cathode. Heat sink element 416 of electrode segment 410 preferably includes an electrical contact formation 436 (FIG. 13) similar to formation 116 of electrode 110 (FIGS. 6 and 7). It will be understood that heat sink elements shaped as rods or bars are also operable for providing heat exchange surfaces for electrodes of the present invention.

The novel segmented DBD electrodes described in connection with FIGS. 9–13 were found to be an improvement over the cylindrical electrodes described in connection with FIGS. 7–8 because the segmented electrodes facilitate the removal or replacement of the electrodes, or changing the distance between electrodes. Also, the segmented electrodes are generally better adapted for providing a predetermined fit or a gap with the outside of the dielectric tube since the segmented electrodes do not need to slide or move on the reactor tube in order to be positioned properly. Preferably, a sealing paste is applied in the space or gap between the inside surface of the electrode segments and the outside surface of the dielectric tube in a manner similar to that described in connection with gap 120 of electrode 110 depicted in FIGS. 7 and 8.

Advantageously, novel segmented electrodes employing biasing elements such as described in connection with electrodes 212 (FIG. 10) and 300 (FIG. 11) allow a closer fit between the inside of the DBD electrode and the outside of the reactor tube, since the biasing element can be adapted for urging the electrode segments together such that the biasing element compensates for differences in thermal expansion or contraction between the reactor tube and the electrode. It will be understood that the fasteners and biasing elements described in connection with the embodiments of the present invention are merely illustrative and that other fasteners and biasing elements can be employed, using such fasteners and biasing elements as are well known to those of ordinary skill in the art. Also, it will be understood that the segments forming an electrode need a high electrical conductivity connection between them and that it is necessary to provide such a connection if the fasteners are non-conductors.

Embodiments of the present invention exemplified in FIGS. 6 through 13 utilize ring shaped electrodes encircling a dielectric tube wherein the electrodes are constructed as rings or segmented rings. Operable ring or cylindrical band shaped electrodes also include conductive foil, such as metal foil, wrapped around the tube such that a foil ring or cylindrical band is formed having a thickness of one or more layers of foil. Operable ring or cylindrical band shaped electrodes also include electrodes that are applied as an electrically conductive layer on the outside of the dielectric tube, forming a ring or cylindrical band, using for example electrically conductive paint or paste compositions such as are well known to those of ordinary skill in the art.

Figure 14:
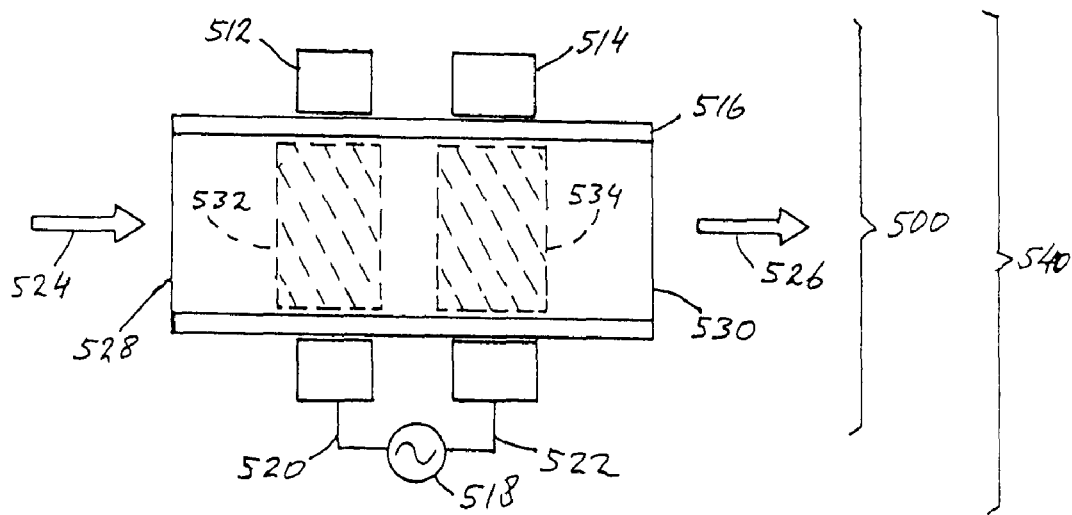
FIG. 14 is a schematic view showing a DBD treatment device of the present invention, including a schematic axial cross section view showing a DBD cell of the present invention.

Another embodiment of the present invention illustrated in FIG. 14, depicts a DBD cell 500 including electrodes 512 and 514, and dielectric tube 516. Examples of suitable cells include previously described cell 100 (FIGS. 6 and 8) and cell 200 (FIG. 9) using electrodes such as electrodes 110 (FIG. 7), 212 (FIG. 10), 300 (FIGS. 11 and 12) and 400 (FIG. 13). Returning to FIG. 14, electrodes 512 and 514 are electrically connected to a high frequency AC (alternating current) power supply 518. Suitable examples of power supply 518 will be described in more detail in connection with power supplies 610 and 710 of DBD plasma treatment devices 600 and 700 respectively, shown in FIGS. 15 and 16.

Electrical connectors 520 and 522 (FIG. 14), using for example conductive wiring, connect power supply 518 to electrodes 512 and 514 respectively, employing for example electrical contact formations (not shown) of each of the electrodes to provide the electrically conductive connection. The combination of DBD cell 500, power supply 518 and connectors 520 and 522 forms a novel DBD treatment device 540.

Figure 20:
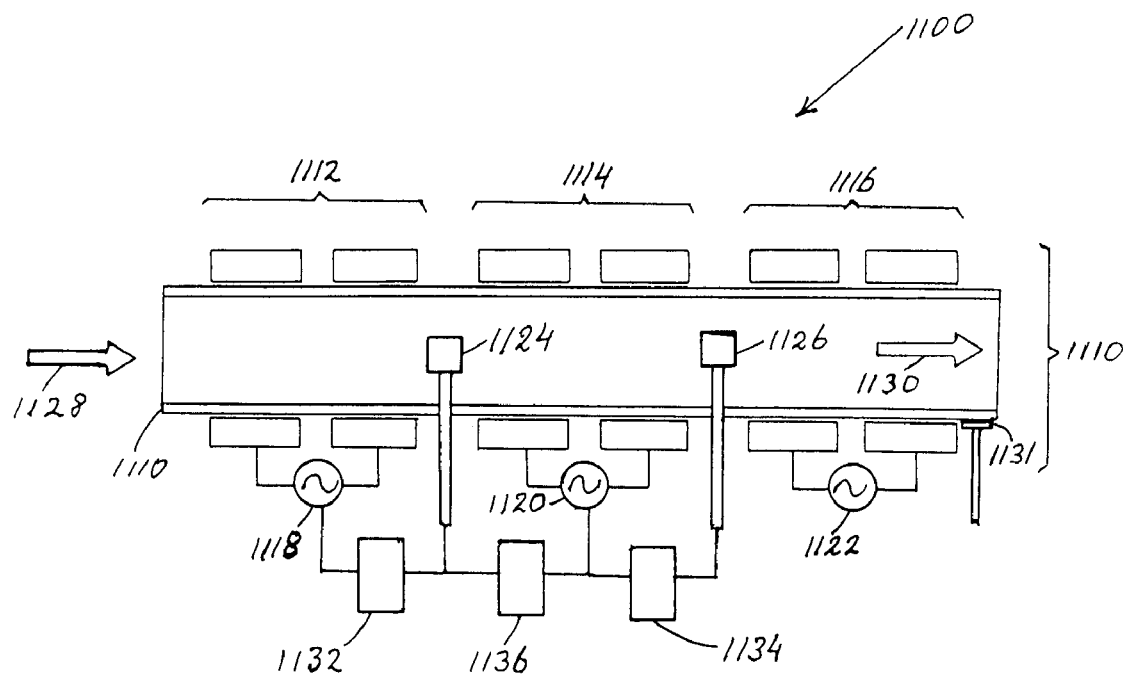
FIG. 20 is a schematic view showing another DBD treatment device of the present invention, including a schematic axial cross section view showing a DBD reactor of the present invention.

A gas stream requiring treatment, for example for removal of noxious substances, flows through cell 500 (FIG. 14) in the direction indicated by arrows 524 and 526. The gas stream enters cell 500 at a gas inlet 528 and is discharged from the cell at a gas outlet 530. A plasma is formed in the gas stream that flows through cell 500 when the cell is energized by activating power supply 518. It is believed that DBD cells of the present invention induce a coupling effect and that the plasma is formed in the gas within the region of the cathode electrode as well as in the region of the anode. The high frequency AC applied to electrodes 512 and 514 causes each of these electrodes to alternate the anode and cathode polarity, while maintaining a plasma in zones 532 and 534, as schematically shown in FIG. 14. The plasma conditions formed in novel cell 500 of novel DBD treatment device 540 are effective for decomposing FCs (fluorocarbons) and for reacting FC with gases such as $O_2$ and $H_2O$ vapor, or mixtures of gases such as $CH_2+O_2$ or $H_2+O_2$. Device 540 was found to be effective for abatement of FCs typically present in gases that are discharged from semiconductor processing devices, such as etch chambers, including fluorine containing by-product gases formed in semiconductor processing devices. These FCs can include $CF_4$, $CHF_3$, $CH_2F_2$, $C_2F_6$, $C_4F_8$ and $C_4F_6$. A controller (not shown) can be employed in connection with power supply 518 of DBD treatment device 540, similar to controllers discussed in connection with DBD treatment device 1100 (FIG. 20). Optionally, one or more sensors (not shown) or gas addition ports (not shown) can be provided for device 540 (FIG. 14), and these can be integrated with the power supply controller as discussed in connection with DBD treatment device 1100.

Figure 15:
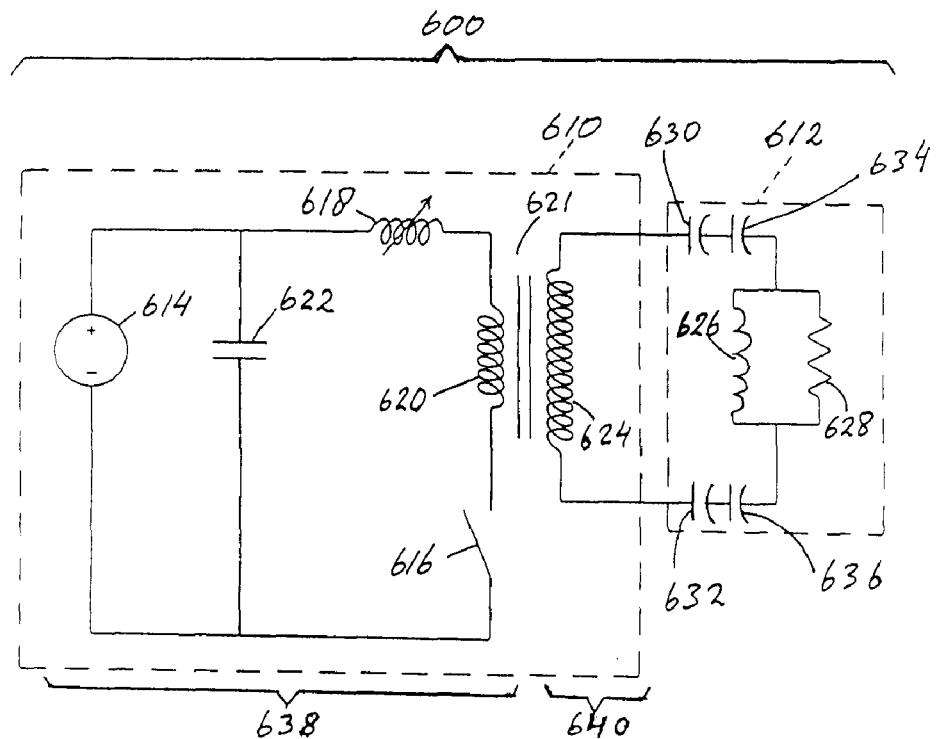
FIG. 15 is a schematic view showing another DBD treatment device of the present invention.

Novel DBD treatment device 600, schematically illustrated in FIG. 15, includes a high frequency AC power supply 610, and DBD cell 612. Power supply 610 is similar to the switching mode resonant power supply disclosed by Shiloh et al. in publication WO 99/26726. Cell 612 is similar to novel DBD cell 500 described in connection with FIG. 14. Returning to FIG. 15, power supply 610 includes a DC power source 614 in series with a switch 616, a variable inductance 618 and primary winding 620 of a transformer 621. A capacitor 622 is positioned in parallel with the DC power source and in parallel with the series including the switch, the variable inductance and the primary winding. Secondary winding 624 of the transformer provides the output AC current of power supply 610 to DBD cell 612.

As shown in FIG. 15, the plasma in DBD cell 612 is schematically represented by an equivalent circuit including a capacitance 626, in parallel with a resistance 628. Inductance 626 represents the plasma reactive impedance, while resistance 628 represents the part of the plasma impedance leading to power flow into the plasma. The capacitance of the wall of the dielectric tube is schematically shown as 630 and 632. Similarly, the sheath capacitance of the plasma is depicted as 634 and 636. In operation, switch 616 is opened and closed at a high frequency. A high AC voltage is developed across the cell when the switching frequency of switch 616 is equal to the resonant frequency of the cell capacitance including the capacitances 630, 634, 632 and 636 with the parasitic inductance of primary transformer winding 620 combined with variable inductance 618. Power supply 610 typically operates at frequencies ranging from about 10 kilohertz to about 3 megahertz, utilizing for example a MOSFET (metal oxide semiconductor field effect transistor) switch 616. Secondary winding 624 typically supplies a peak voltage ranging from about 300 volts to about 100 kilovolts. DBD treatment device 600 provides FC abatement similar to that described in connection with device 540 depicted in FIG. 14.

Figure 16:
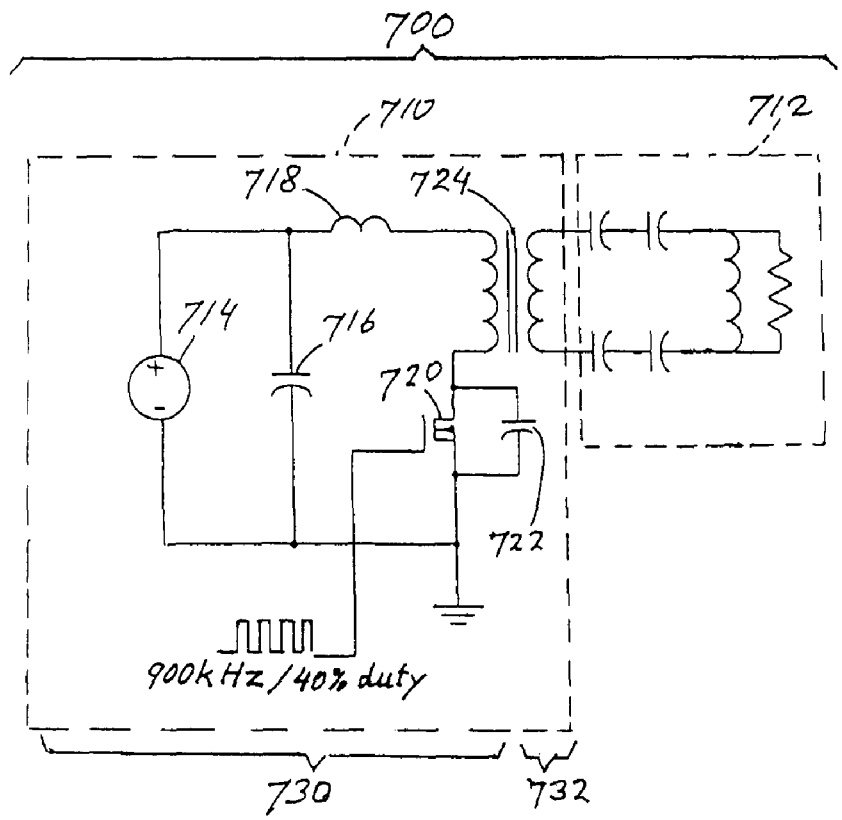
FIG. 16 is a schematic view showing another DBD treatment device of the present invention.

A preferred embodiment of a DBD treatment device 700 of the present invention is illustrated in FIG. 16. This device includes a novel switched mode, resonant high voltage power supply, SMPD (self-matched plasma device) 710 and a DBD cell 712 similar to cell 612 of device 600 shown in FIG. 15. Returning to FIG. 16, SMPD 710 includes a DC power supply 714, providing a DC voltage input preferably ranging from about 30V to about 48V. SMPD 710 further includes a low ESR (equivalent series restriction) capacitor 716, an inductance 718, a MOSFET switch 720 preferably 600W/500V, a snubber capacitor 722 and a transformer 724. Typically, transformer 724 includes a primary to secondary ratio of about 1 to about 20. The drain to source voltage at MOSFET switch 720 typically rises up to 300V at the opening phase. Preferably, the primary current ranges from 20 A to about 30 A while the secondary current is about 1 A. The switching frequency is about 900 kHz. A preferred peak voltage between the electrically floating electrodes of DBD cell 712 is about 3KV. As shown in FIG. 16, power supply 710 includes a DC power supply section 730 and a high voltage AC power supply section 732.

The energy of SMPD 710 (FIG. 16) resonates between the capacitance load and the inductance of the driving circuit. Operating MOSFET switch 720 in the proper frequency range pushes the energy in the resonant mode. The load capacitance due to operation of DBD cell 712 is a function of the electrode-to-plasma capacitance, that is mainly the capacitance of the cell's dielectric tube, in series with the plasma sheath capacitance, typically a few tens pF. Some parasitic capacitance from the electrode structure, SMPD wiring and the transformer is added in parallel to the load capacitance. The voltage at the electrodes rises resonantly until ignition of the plasma. Following plasma ignition, the resonance broadens due to resistive loading of the plasma. Consequently, specific tuning is generally not necessary. SMPD 710 is capable of igniting a plasma and maintaining it at various gas compositions and flow rates using the same frequency, and operating at pressures ranging between 10 mTorr and 10 Torr.

Preferably, DC power supplies such as 614 (FIG. 15) and 714 (FIG. 16) include constant DC power supplies. Examples of suitable, well known, constant DC power supplies include DC power supplies delivering a constant voltage and DC power supplies delivering a constant current.

It is highly desirable to deliver a constant power into the plasma. However, the load impedance of the plasma is not constant due to varying conditions of the gas. These load variations are manifested at the input of the high voltage power supply as load impedance variations for the DC power supply. The use of a constant voltage or a constant current DC power supply therefore requires stabilization of the power flow into the plasma to obtain a substantially constant value through dynamic control of the pulse width that drives the high voltage power supply. This dynamic control was found to be complicated to achieve and not very efficient for striking and maintaining an effective plasma in DBD reactors of the present invention. In preferred embodiments of DBD treatment devices of the present invention, such as device 600 (FIG. 15) and device 700 (FIG. 16) it was discovered that constant power DC power supplies alleviated the technical problems associated with the use of constant voltage and constant current D power supplies. A constant power DC power supply (not shown) was prepared by modifying a conventional voltage regulated power supply (not shown) in the following manner. The voltage output V and current output I were measured. An electronic multiplier was utilized to produce a voltage proportional to V times I, which was compared to a pre-set value. The output of the comparator was then used to control the output of voltage of the power supply in order to thereby obtain a constant power flow into the plasma.

Figure 17:
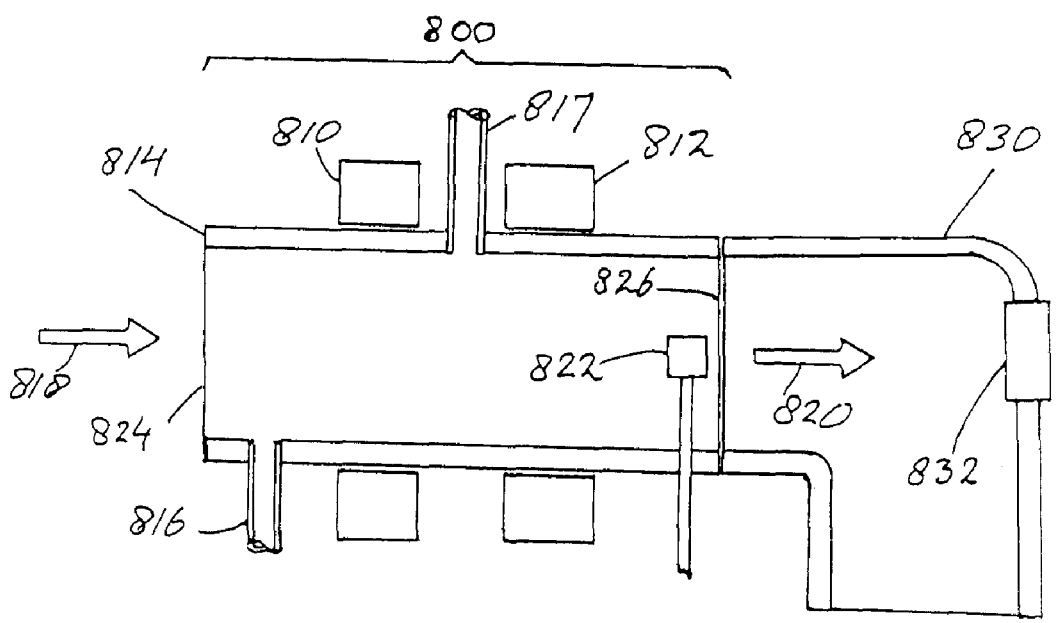
FIG. 17 is a schematic axial view showing another DBD cell of the present invention.

FIG. 17, depicting DBD cell 800, illustrates another embodiment of the present invention. Novel DBD cell 800 includes electrodes 810 and 812, and dielectric tube 814. Examples of suitable electrodes for electrodes 810 and 812 include electrodes 110 (FIG. 7), 212 (FIG. 10), 300 (FIGS. 11 and 12) and 400 (FIG. 13), while suitable tubes for dielectric tube 814 of novel DBD cell 800 include tube 114 of novel DBD cell 100 (FIGS. 6–8), tube 210 of novel DBD cell 200 (FIG. 9) and tube 516 of novel DBD cell 500 (FIG. 14). Returning to FIG. 17, cell 800 is provided with a port 816 for adding gases to the gas stream flowing through the cell in the direction shown by arrows 818 and 820. Additionally, cell 800 includes a sensor or probe 822 for determining gas pressure, or for analyzing or determining the gas composition using for example Langmuir probes, laser induced fluorescence, mass spectrometry, FTIR spectroscopy, optical emission spectroscopy and such other chemical and physical analytical or diagnostic procedures and techniques as are well known to those of ordinary skill in the art. It is also contemplated to utilize novel DBD cells (not shown) having either a port for introducing gases or a sensor for determining gas composition, or having several gas introduction ports and/or several sensors. Additionally, it is contemplated to provide one or more gas introduction ports positioned outside gas inlet 824 of cell 800 and/or one or more sensors positioned outside gas outlet 826, in place of or in addition to port 816 and sensor 822.

Optionally, cell 800, depicted in FIG. 17, can be provided with a gas introduction port 817 that is positioned in tube 814 between electrodes 810 and 812. Ports and sensors that are positioned outside cell 800 can be placed in a conduit (not shown) that is operably connected to the cell. Optionally, an elbow shaped conduit 830 can be operably connected to tube 814, causing the gas stream to flow through this conduit. A window 832, for example made of sapphire, can be mounted in the elbow section to provide an optical path into the interior of cell 800 in order to make optical observations and measurement of a plasma (not shown) that is formed in the cell. Optionally, a window (not shown) can be mounted in the wall of tube 814 for optical observations and measurements. Additionally, a contact probe such as a thermocouple (not shown) can be positioned in thermally conductive contact with the outside surface of tube 814 to measure tube temperature.

Figure 18:
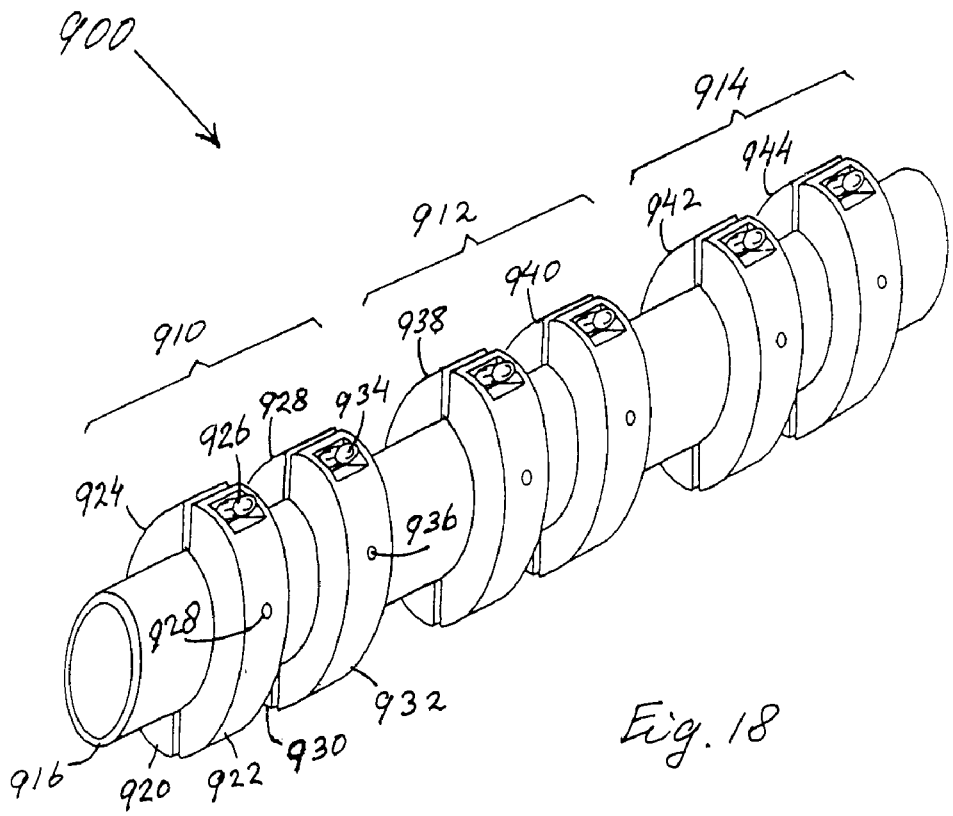
FIG. 18 is a perspective view showing a DBD reactor of the present invention.

In another embodiment of the present invention depicted in FIG. 18, a DBD reactor 900 is provided for abatement of noxious gases. This reactor includes novel DBD cells 910, 912 and 914, and dielectric reactor tube 916. DBD cells 910, 912 and 914 are similar to novel DBD cell 200 shown in FIG. 9. DBD cell 910 includes electrode segments 920 and 922 forming electrode 924, using one or more fasteners 926, see FIG. 18. Electrode 924 preferably includes an electrical contact formation 928. Similarly, electrode 928 of DBD cell 910 includes electrode segments 930 and 932, fastener 934 and preferably contact formation 936. DBD cells 912 and 914 are similar to cell 910, wherein cell 912 includes electrodes 938 and 940 while cell 914 includes electrodes 942 and 944.

The six electrodes of reactor 900 (FIG. 18) are placed in side-by-side positions on reactor tube 916. Each of these cells utilizes a different portion of tube 916 to provide the dielectric's capacitance for forming a plasma upon activation of the cells while a gas stream flows through tube 916. The capacitance portion of reactor tube 916 with regard to each cell is substantially the tube portion encircled by the electrodes and additionally the tube portion between the electrodes of a cell. Portions of reactor tube 916 that are located between adjacent DBD cells are not components of the DBD cells of DBD reactor 900, thus forming a series of individual cells that are connected by sections of tube 916. Optionally, one or more ports (not shown) and/or one or more sensors or probes can be provided to reactor 900. The one or more ports can be provided in tube 916, similar to port 816 of cell 800 (FIG. 17). Also, the one or more sensors can be positioned in a similar manner as sensor 822 of cell 800. Additionally, it is contemplated to place ports or sensors in one or more conduits (not shown) that are operably connected to tube 916 of reactor 900 shown in FIG. 18.

Figure 19:
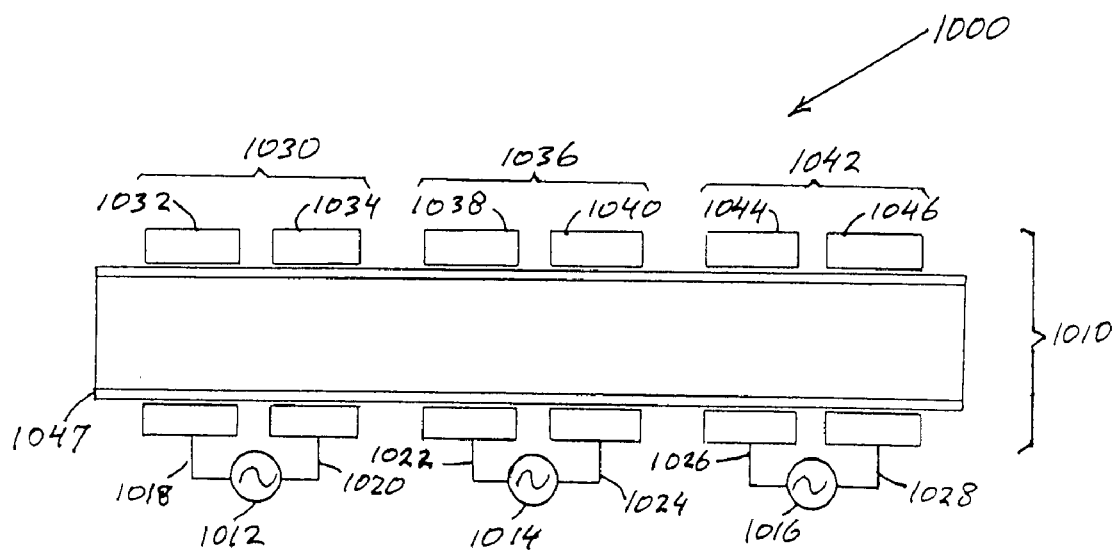
FIG. 19 is a schematic view showing a DBD treatment device of the present invention, including a schematic axial cross section view showing a DBD reactor of the present invention.

DBD treatment device 1000, depicted in FIG. 19, provides another embodiment of the present invention. Device 1000, includes a DBD reactor 1010, similar to DBD reactor 900 shown in FIG. 18, and high frequency AC power supplies 1012, 1014 and 1016 as well as electrical connectors 1018, 1020, 1022, 1024, 1026 and 1028 for connecting the power supplies to the DBD cells of device 1000. The electrical connectors can be connected to contact formations (not shown) of the electrodes. Examples of suitable power supplies include power supply 610 of DBD treatment device 600 (FIG. 15) and power supply 710 of DBD treatment device 700 (FIG. 16). DBD reactor 1010 includes DBD cell 1030 having electrodes 1032 and 1034, DBD cell 1036 having electrodes 1038 and 1040, DBD cell 1042 having electrodes 1044 and 1046, and dielectric reactor tube 1047. Typically, the inside diameter of dielectric tube 1047 ranges from about 38 mm to about 51 mm. A preferred inside diameter is 51 mm. The wall thickness of reactor tube 1047 should be as thin as possible while providing sufficient mechanical strength for its intended use. For example, an alumina tube wall thickness of about 4 mm to about 5 mm is generally suitable for many DBD reactor applications. Plasmas similar to those formed in DBD treatment device 540 (FIG. 14) are formed in device 1000 when cells 1030, 1036 and 1042 are activated by power supplies 1012, 1014 and 1016 respectively, when a gas is present in reactor tube 1047. Preferably, DBD reactors of the present invention should be operated in a closed environment wherein an air flow is employed to provide effective cooling of the reactor.

Another embodiment of the present invention is illustrated in FIG. 20, depicting DBD treatment device 1100 including novel DBD reactor 1110. This reactor includes reactor tube 1111, novel DBD cells 1112, 1114 and 1116, connected to high frequency AC power supplies 1118, 1120 and 1122 respectively. Tube 1111, cells 1112, 1114 and 1116, and power supplies 1118, 1120 and 1122 are similar to the corresponding components of DBD treatment device 1000 shown in FIG. 19. One or more sensors or probes 1124 and 1126, similar to sensor 822 of novel DBD cell 800 (FIG. 17) are positioned inside reactor tube 1110 to measure for example gas pressure and/or gas composition of the gas stream flowing through DBD reactor 1110 in the direction indicated by arrows 1128 and 1130, as shown in FIG. 20. Additionally, a temperature measuring or indicating device 1131 such as a thermocouple can be positioned in thermally conductive contact with the outside surface of tube 1110 using such methods, techniques and devices as are know to those of ordinary skill in the art, in order to measure the temperature of the dielectric tube. Optionally, one or more ports (not shown) and/or one or more additional sensors can be provided to DBD treatment device 1100 in a similar manner as described in connection with reactor 900 (FIG. 18).

As illustrated schematically in FIG. 20, a controller 1132 is operably connected to sensor 1124 and to power supply 1118. Similarly, a controller 1134 is operably connected to sensor 1126 and to power supply 1118. Additionally, a controller 1136 is operably connected to sensor 1124 and to power supply 1120. Examples of suitable controllers 1132, 1134 and 1136 include conventional computers and computer systems including one or more computers that are operably connected to other computers or to a network of computers or date processing devices. Suitable computers also include microprocessor based computers commonly known as personal computers. While FIG. 20 shows three controllers, i.e. 1132, 1134 and 1136 it is also contemplated to use one computer that provides the separate functions of controllers 1132, 1134 and 1136. Controller 1132 utilizes an output signal from sensor 1124 to control power supply 1118. Similarly, controller 1134 adjusts, controls or regulates power supply 1120 based on an output signal from sensor 1126. Controller 1136 employs an output signal from sensor 1124 to control power supply 1120.

Novel DBD treatment device 1000, shown in FIG. 19, and novel DBD treatment device 1100, depicted in FIG. 20, each employ a series of three DBD cells wherein each cell has a power supply. Preferably, the three power supplies of each of these devices are dedicated power supplies to provide individual control to each cell, thus providing a reactor capability for individually controlling the plasma conditions in each cell of the reactor. For example, a gas stream containing noxious substances such as FCs flowing through novel DBD reactor 1110 (FIG. 20) can be exposed to plasmas (not shown) in cells 1112, 1114, 1116 operating such that each plasma destroys, or reacts with, only a portion of the total noxious gas content of the gas stream. However, the three plasmas combined can provide a complete or nearly complete DRE (destruction removal efficiency) while operating at a lower power level than a single cell that achieves a similar DRE. The multi-cell reactor typically operates at a lower temperature than a single cell, thereby providing less thermal stress on the equipment and less waste heat.

Advantageously, a multi-cell reactor of the present invention employing individual power supplies provides a modular reactor having the capability to selectively treat different gases in the gas stream by one or more specific cells. This selective treatment can include introducing a reactive gas in the reactor itself or upstream of the reactor. For example, a reactive gas or gas mixture can be introduced in a conduit (not shown) operably attached to the gas inlet of the reactor tube such that the gas introduction port is positioned at a distance of approximately 500 cm from the gas inlet of the reactor tube. Typically, the reactive gas is effectively mixed with the gas that needs to be treated in the reactor when the gases flow together over a distance of approximately 500 cm. However, it is also contemplated to mix gases prior to plasma treatment by utilizing static or dynamic mixing elements such as are known to those of ordinary skill in the art. Alternatively gas mixture can be pre-treated such as heated or subjected to DBD plasma treatment prior to treatment in a DBD reactor of the present invention.

The DRE can be monitored at different cells in a multi-cell reactor using a variety of sensors such as sensors 1124 and 1126 of novel DBD treatment device 1100, shown in FIG. 20. Output from a sensor can be utilized to control the power supply of the relevant cell. Preferably, sensor output is utilized to automatically control the power supply of the relevant cell in order to provide rapid noxious gas abatement responses when there are rapid changes in the noxious gas stream. For example, DBD treatment device 1100, depicted in FIG. 20, utilizes controller 1132 to control power supply 1118 of DBD cell 1112. Controller 1132 is programmed to receive the output signal from sensor 1124 and to compare this signal with a pre-determined signal value range indicating a desirable or design DRE. The controller then causes the necessary adjustments to be made in the operation of power supply 1118 if the output signal is not in the predetermined value range. Similarly, controller 1136 can be utilized to control power supply 1120 of DBD cell 1114 in order to affect the abatement efficiency of cell 1114 as a function of the gas stream properties/composition as analyzed by sensor 1124. A similar control loop (not shown) can be provided between a sensor and a gas flow rate controller (not shown) that controls the flow of an additive gas, such as for example $O_2$ or $CH_4 + O_2$. Control of the independently controlled power supplies of the cells of treatment device 1100 can thus be achieved through the techniques for gas analysis or gas pressure measurement at various points in the reactor tube and also by determining the temperature of the outside surface of the reaction tube. These analytical techniques and the pressure and temperature determinations can thus be utilized to control the operation of each independently controlled DBD cell of the present invention. Similarly, the addition of reactive gases to treatment device 1100 can be controlled through these analytical, pressure and temperature measuring techniques.

While DBD reactors 900 (FIG. 18), 1010 (FIG. 19) and 1110 (FIG. 20) of the present invention each include three DBD cells, it will be understood that reactors including three DBD cells are merely illustrative of the invention and that the present invention is also operative for DBD reactors having two cells, or having more than three DBD cells. For example, novel DBD reactors having six, seven or eight cells, were found to be particularly effective for abatement of fluorine compounds that are discharged from semiconductor fabricating equipment, such as etch chambers.

Figure 21:
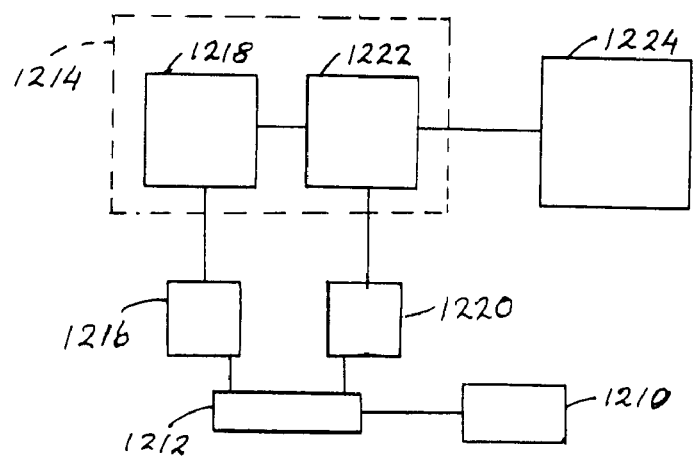
FIG. 21 is a schematic view showing a controller for controlling a high frequency power supply of a DBD treatment device of the present invention.

FIG. 21 illustrates a technique for utilizing a controller, such as controller 1132 of novel DBD treatment device 1100 (FIG. 20), to control an AC power supply 1214 such as power supply 1118 of device 1100. Returning to FIG. 21, sensor output 1210 is entered into controller 1212. Controller 1212 compares the sensor output with a pre-determined range of acceptable or design values. If the sensor output is outside the pre-determined range, the controller can cause high frequency AC power supply 1214 to be adjusted. For example, an adjustment 1216 can be made in the DC power of DC power supply section 1218 of high frequency AC power supply 1214. Alternatively, controller 1212 can be utilized to make an adjustment 1220 in either the frequency or the pulse width of AC power supply section 1222 of high frequency AC power supply 1214. These adjustments are then employed to adjust and control the plasma (not shown) that is generated in DBD cell 1224 of the present invention. Examples of suitable high frequency AC power supplies for use with controller 1212 include power supply 610 of novel DBD treatment device 600 (FIG. 15) and power supply 710 of novel DBD treatment device 700 (FIG. 16).

Figure 22:
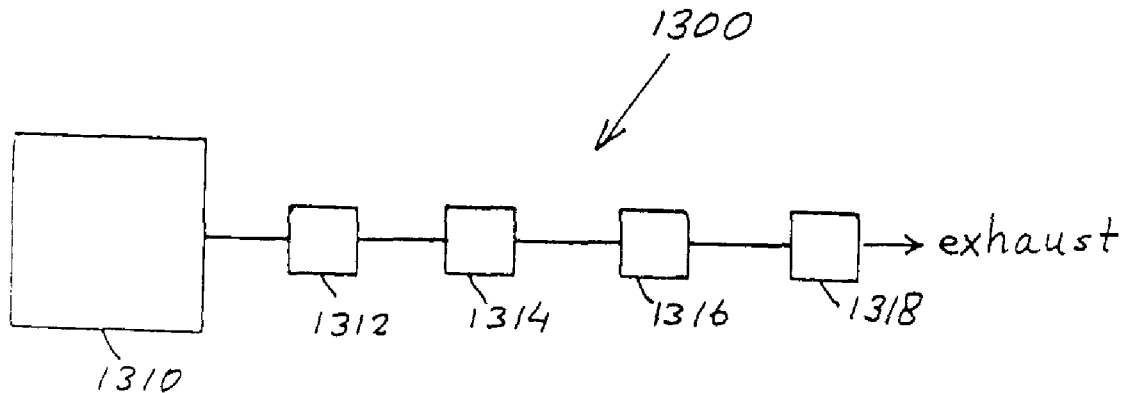
FIG. 22 is a schematic view showing a wafer fabricating system of the present invention.

Semiconductor or wafer processing system 1300, schematically illustrated in FIG. 22, provides another embodiment of the present invention. System 1300 includes a wafer or semiconductor fabricating device or tool 1310, such as a wafer fabricating chamber for example an etch chamber, a conventional first vacuum pump 1312 such as a turbomolecular pump or a mechanical pump such as a roughing/backing pump, a DBD treatment device of the present invention 1314, a conventional second vacuum pump 1316 and a conventional wet or dry scrubber 1318. These components are operably connected as schematically depicted in FIG. 22. System 1300 can employ additional conventional components (not shown) such as isolation valves, throttle valves, pressure gauges, temperature gauges and one or more forelines for process control. Suitable examples of DBD treatment device 1314 of the present invention include device 540 (FIG. 14), 600 (FIG. 15), 700 (FIG. 16), 1000 (FIG. 19) and 1100 (FIG. 20). Alternatively, a semiconductor or wafer processing system of the present invention can include a semiconductor or wafer fabricating device, a DBD treatment device of the present invention and a gas flow connection positioned between the fabricating device and the dielectric tube of the DBD device. Examples of suitable flow connections include a foreline, one or more conduits, one or more pumps and one or more gas control valves.

Returning to FIG. 22, pump 1312 is utilized to pump processing gases from fabricating device 1310 to DBD treatment device 1314 for PET (plasma exhaust treatment) to react or remove gases such as FCs. The gases that are discharged from DBD treatment device 1314 are pumped to scrubber 1318 by means of pump 1316. Also, the invention is equally operable without first pump 1312 (FIG. 22), providing the gas flow conditions in DBD treatment device 1314 are suitable for forming a plasma for treating the gas that is discharged from fabricating device 1310.

Figure 23:
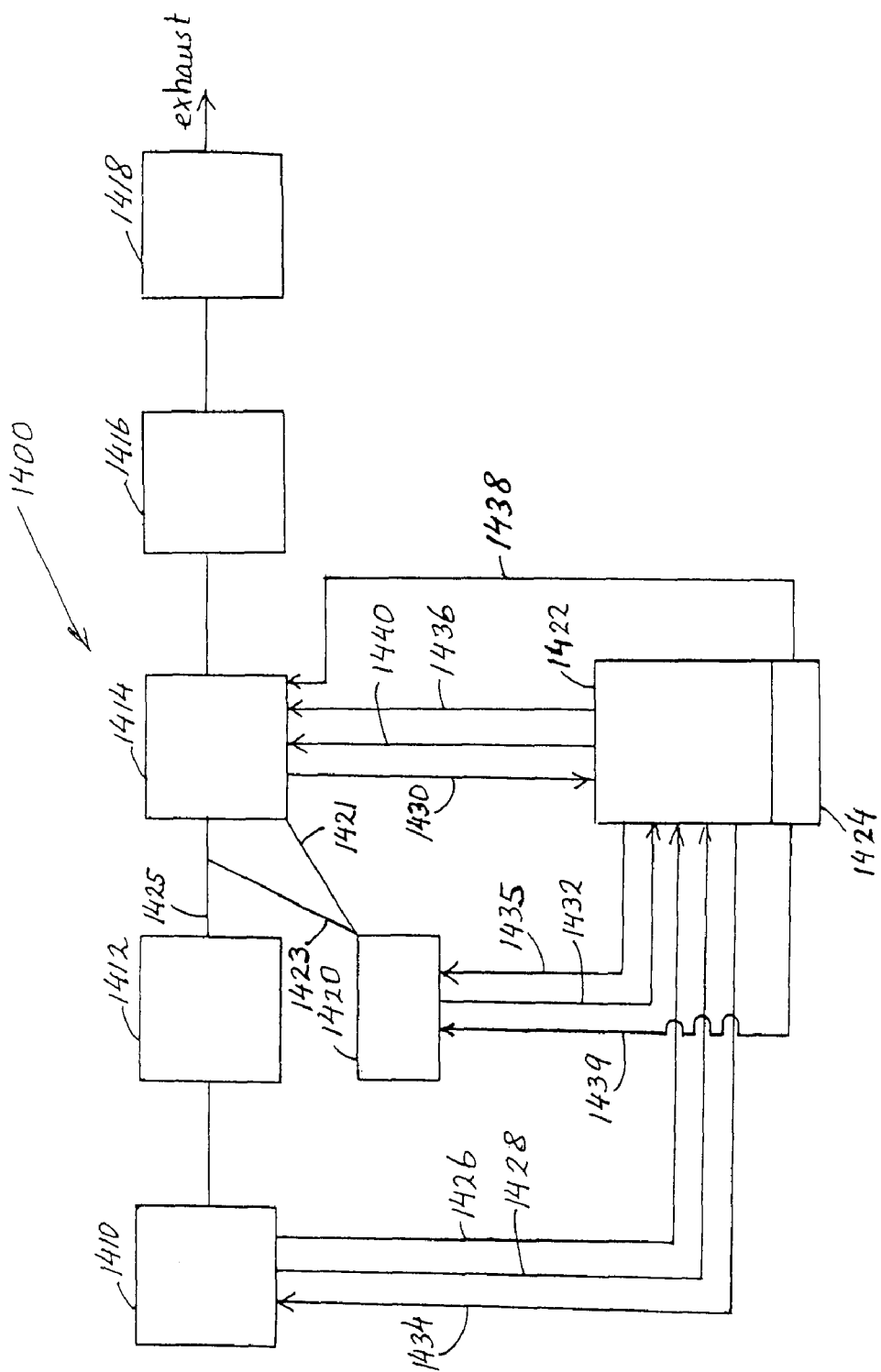
FIG. 23 is a schematic view showing another wafer fabricating system of the present invention.

Semiconductor or wafer processing system 1400, as schematically illustrated in FIG. 23, provides another embodiment of the present invention. System 1400 includes a semiconductor fabricating device 1410, a first vacuum pump 1412, a DBD treatment device of the present invention 1414, a second vacuum pump 1416 and a scrubber 1418. These components are similar to the corresponding components described in connection with semiconductor or wafer processing system 1300, depicted in FIG. 22. Returning to FIG. 23, processing system 1400 additionally includes a gas panel 1420 for providing one or more gases for use in conjunction with DBD treatment device 1414, using for example a conduit 1421, for introducing one or more gases in the DBD treatment device. Alternatively, one or more gases can be introduced through a conduit 1423 to conduit 1425 positioned between vacuum pump 1412 and DBD treatment device 1414. This system also includes a controller 1422, such as a computer, for controlling and interacting with fabricating device 1410, DBD treatment device 1414 and gas panel 1420. Additionally, system 1400 includes an interlock feature 1424 in connection with controller 1422 for interacting with the DBD treatment device of system 1400, as shown in FIG. 23. The interlock feature can for example be utilized to stop or interrupt the plasma treatment if the gas pressure is below a predetermined pressure, or if the temperature inside the dielectric tube or the tube wall exceeds a pre-defined limit, or upon the occurrence of any other pre-defined processing condition.

Controller 1422, shown in FIG. 23, receives status information 1426 from fabricating device 1410 and information concerning gas flow rates 1428 and gas composition of gases that are discharged from device 1410. Additionally, controller 1422 receives status information 1430 from DBD treatment device 1414, for example whether device 1414 is on or off. Also, controller 1422 receives information concerning gas flow rates 1432 of gases flowing from gas panel 1420 to DBD device 1414. Controller 1422 processes the information described above and then in accordance with programmed instructions, controller 1422 reports status information 1434 regarding the abatement process to fabricating device 1410. The controller also provides gas flow rate instructions 1435 to the gas panel and provides shut down instructions 1436 to DBD device 1414. Interlock feature 1424 provides shut down instructions 1438 to the DBD device upon the occurrence of predetermined processing events as determined by the controller. Interlock feature 1424 can provide instructions 1439 to one or more gas valves (not shown) of gas panel 1420 to close, for example, the valve(s) upon the occurrence of pre-determined processing events as determined by controller 1422. When starting a processing run or cycle with DBD device 1428, controller 1422 can be programmed to cause DBD device 1414 to be activated following a predetermined delay time interval 1440 that is initiated by the computer program for starting discharge of processing gas from fabricating device 1410. It will be understood that interlock feature 1424 can be provided as a unit that is separate from controller 1422, as illustrated in FIG. 23, as well as an interlock feature that is a function of a controller, and is integral with the controller (not shown).

DBD cells and reactors of the present invention provide plasma treatment over a wide range of gas pressures inside the cell or reactor tube, generally ranging from about 100 mTorr to about 10 Torr. A typical gas pressure inside the tube ranges from about 100 mTorr to about 1200 mTorr. Higher pressures, such as 10 Torr, typically require a smaller tube diameter and/or a lower cell AC frequency than very low pressures, in order to obtain effective plasma coupling.

Preferably, DBD cells and DBD reactors of the present invention, such as cells 100 (FIG. 6), 500 (FIG. 14), 800 (FIG. 17), and reactors 900 (FIG. 18), 1010 (FIG. 19) and 1110 (FIG. 20) are provided with a cooling feature (not shown) to cause the reactor tube and the electrodes to be cooled. A suitable cooling feature includes a housing substantially enclosing the DBD cell or reactor therein, and providing an air flow for contacting the tube of the cell or reactor and the electrodes. This cooling feature can be enhanced by cooling the air prior to entering into the enclosure or by providing a heat exchanger inside the housing, using a coolant such as water. Additionally, the cooling feature can be adapted to provide an interlock (not shown) for switching the DBD cell or reactor or the DBD treatment device off when, for example, the temperature inside the housing exceeds a pre-defined temperature, or when coolant is leaking from the heat exchanger.

As described in connection with FIGS. 22 and 23, one or more conventional vacuum pumps are typically used in conjunction with DBD treatment devices of the present invention. In an alternative wafer processing system (not shown), the novel DBD treatment device can be positioned in a foreline between the wafer fabricating device and the vacuum pump. An example of a pump suitable for processing systems such as systems 1300 (FIG. 22) and 1400 (FIG. 23) includes an IPUP (integrated point of use pump). An IPUP (not shown) typically includes a series of pump stages that is integrated to form one vacuum pump. Integration of pump stages can include (1) placement of the stages on a common support base, (2) a common drive mechanism such as a single motor causing pumping action in each of the stages and (3) common utilities such as electrical power and coolant. An example of an IPUP is an ADP pump available from ALCATEL, located in Annecy Cedex, France. The ADP includes five Roots type vacuum pumping stages that are placed in series on a common support base and sharing a common drive and common utilities such as electrical power and cooling water.

Figure 24:
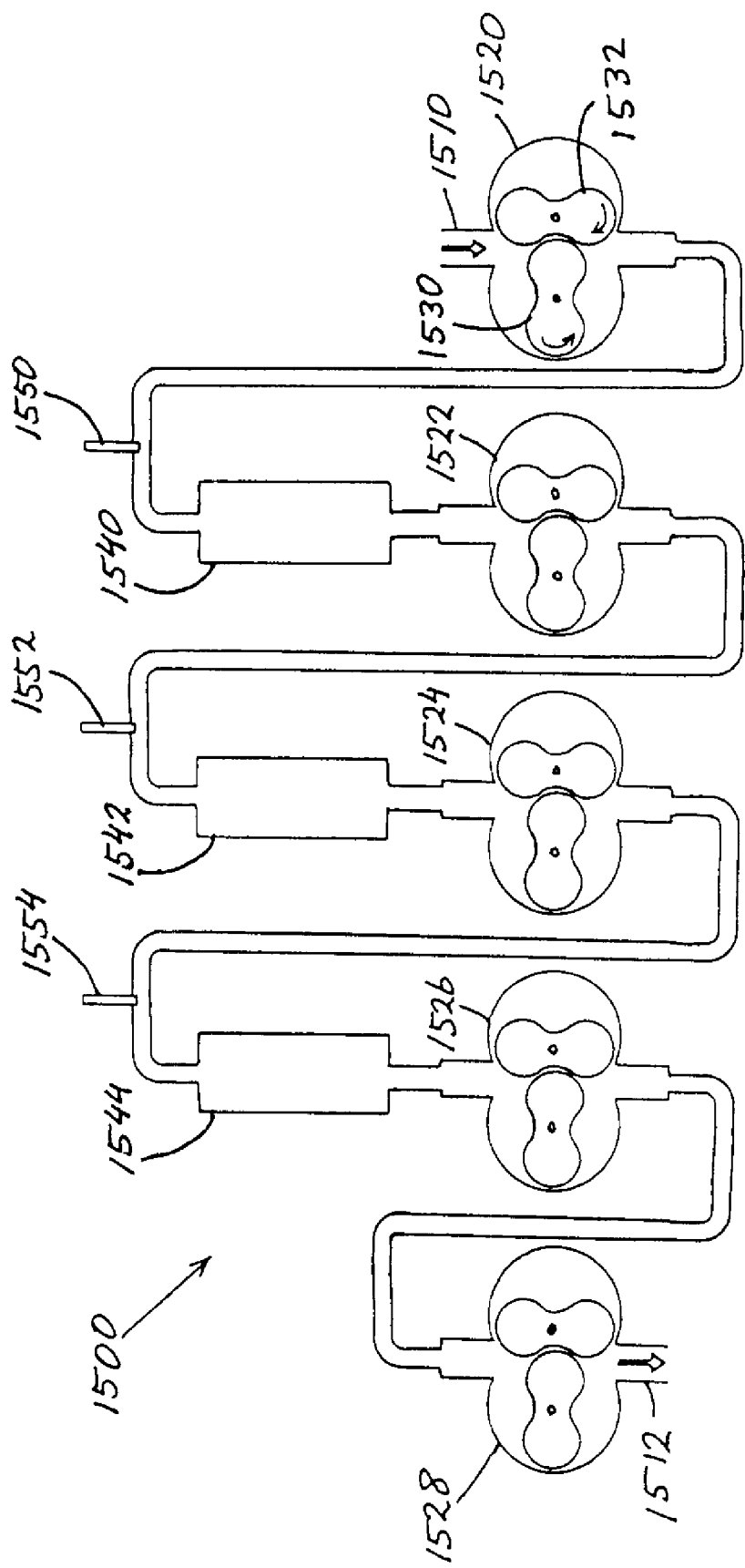
FIG. 24 is a schematic view illustrating a pump integrated DBD treatment apparatus of the present invention.

In another embodiment of the present invention, novel DBD treatment devices are integrated with the pumping stages of an ADP pump, as depicted in FIG. 24, to form a novel pump integrated DBD treatment apparatus 1500. As illustrated in FIG. 24, pump integrated DBD treatment apparatus 1500 of the present invention includes an inlet 1510, an outlet 1512, five Roots pumping stages 1520, 1522, 1524, 1526 and 1528, and three DBD treatment devices of the present invention 1540, 1542 and 1544. Each of the Roots pump stages includes two conventional lobe shaped rotors that rotate without touching each other, such as rotors 530 and 532. Each stage further includes conventional power and cooling sub-systems. Optionally, integrated apparatus 1500 includes sensors 1550, 1552 and 1554, similar to sensors such as sensors 1124 and 1126 that are described in connection with FIG. 20. Returning to FIG. 24, sensors 540, 542 and 544 can be positioned in the conduit between a DBD treatment device and the adjacent Roots stage or in a DBD treatment device itself (not shown). Inlet 1510 can communicate with a wafer or semiconductor fabricating device or tool (not shown), such as fabricating device 1310, shown in FIG. 22, for example through a conventional foreline (not shown). Outlet 1512 (FIG. 23) can discharge gases from apparatus 1500 to for example an additional conventional vacuum pump (not shown) or to a conventional scrubber (not shown). Pump stages 1520, 1522, 1524, 1526 and 1528 are integrated through a common, or shared, support base, a common drive mechanism and common utilities including electrical power and cooling water.

When a gas is pumped at vacuum pressure through apparatus 1500 (FIG. 24), the pressure at DBD device 1544, is lower than the pressure between stages 1526 and 1528. Similarly, the pressure at DBD device 1542 is lower than at DBD device 1544, while the pressure at DBD device 1540 is lower than the pressure at DBD device 1542. Thus, each of the three DBD treatment devices of novel pump integrated DBD treatment apparatus 1500 operates at a vacuum pressure that is different from the other DBD devices of the same pump integrated DBD treatment apparatus. In order to optimize the plasma coupling of each of the three DBD treatment devices it is highly desirable to operate the devices at different frequencies such that a higher frequency is used at lower pressure. Also, for the purpose of maximizing DBD plasma coupling it is highly desirable to select a different reactor tube diameter for DBD reactors in the three DBD devices such that a larger diameter tube is used at lower pressure. For example, the frequency for the plasma in DBD device 1540 should be higher than the frequency for the plasma in DBD device 1542, while the reactor tube in DBD device 1540 should have a larger inside diameter than the reactor tube in DBD device 1542. Sensors such as sensors 1550, 1552 and 1554 can be employed to determine the vacuum pressure at each of the three DBD devices, and to use the results of these pressure determinations for optimizing the configuration, such as tube diameter, and/or the operating parameters such as frequency. Alternatively, experimental pressure determinations can be made without the use of permanently installed sensors, in order to determine the optimal configuration and/or operating parameters.

In other embodiments of the present invention it is also contemplated to provide a pump integrated DBD treatment apparatus, such as illustrated in FIG. 24, having four pumping stages in series that are integrated with two DBD treatment devices as well as a pump integrated DBD treatment apparatus having n pumping stages in series that are integrated with n minus 2 DBD treatment devices. In this context, n denotes the number of pumping stages and n minus 2 denotes the number of DBD treatment devices. A pump integrated DBD treatment apparatus of the present invention can be employed for the treatment of noxious gases including fluorocarbons.

It is also contemplated to employ five separate vacuum pumps in series and to position a DBD treatment device of the present invention between adjacent pump without integrating (not shown) the five pumps with the three DBD treatment devices.

Figure 25:
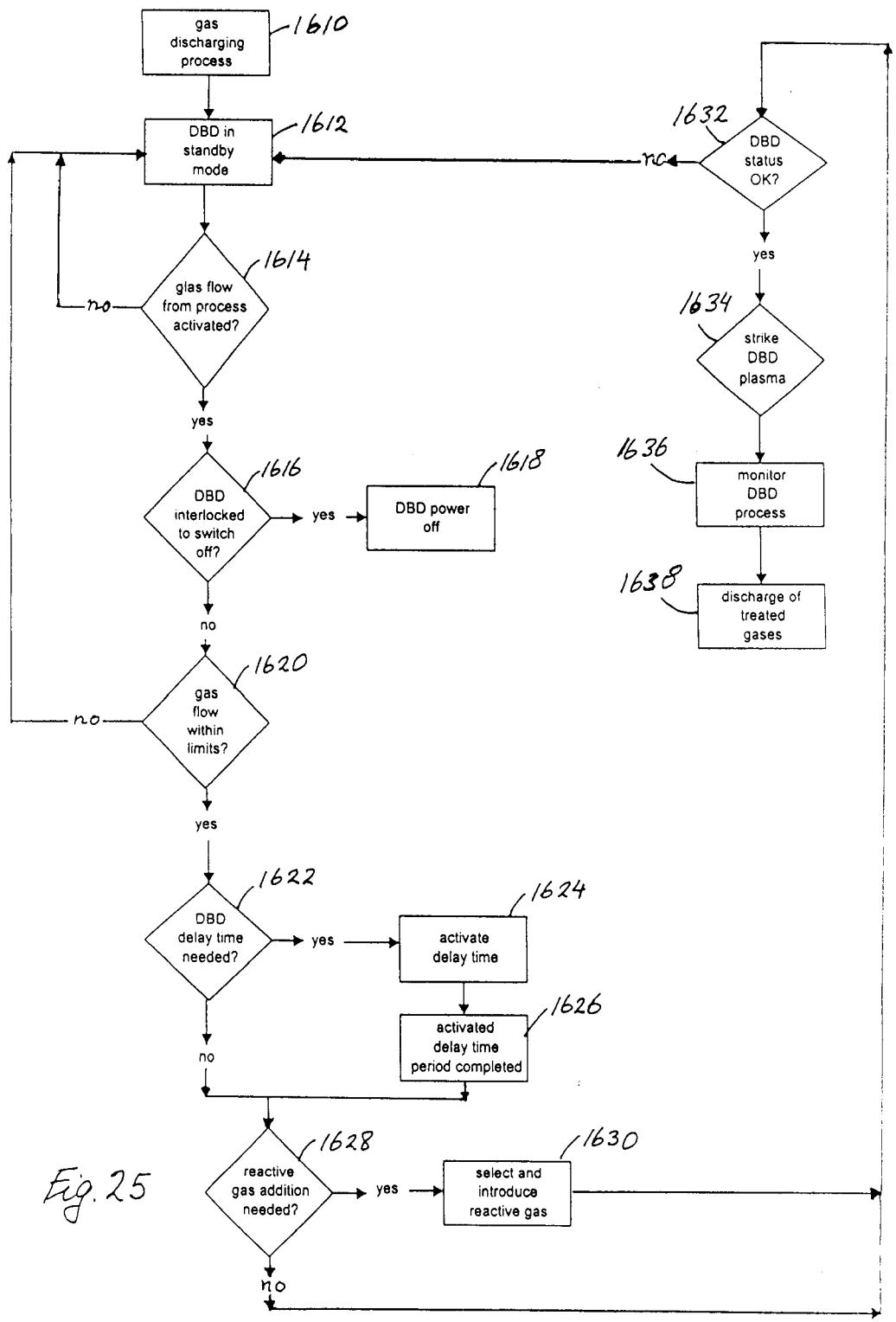
FIG. 25 is a flow chart illustrating a method of the present invention for treating gases that are discharged from a process.

A flow chart illustrating another embodiment of the present invention is shown in FIG. 25. A gas discharging process 1610 such a wafer fabrication tool, for example an etch reactor, is adapted for discharging one or more process gases or by-product gases to a DBD treatment device of the present invention, such as DBD treatment devices 1000 and 1100 illustrated in FIGS. 19 and 20 respectively. Returning to FIG. 25, the DBD device is in a standby mode 1612 such that it is not activated to strike a plasma in the DBD reactor of the DBD treatment device. A process determination 1614 is made to determine if processing gas is flowing from process 1610. Where there is no gas flow, the DBD reactor standby status is continued. If a gas flow is indicated, an automated process inquiry 1616 is made to determine if one or more interlocks are activated causing the power to the DBD device to be turned off 1618 or alternatively (not shown) causing the DBD device to be in a standby mode. Suitable interlocking techniques are exemplified by interlock feature 1424 described in connection with FIG. 23. If the DBD device is not switched off as a result of an interlock feature, a next process determination 1620 is made to determine if the gas flowing to/or through the DBD device is within pre-defined processing limits such as pressure and/or temperature. Examples of suitable processing limits for the treatment of FCs in the novel DBD device include a pressure greater than about 100 mT and a temperature lower than about 100° C. The DBD device remains in the standby mode 1612 if the gas flow is not within the pre-defined limits.

Where the gas flow is found to within the pre-defined limits, a subsequent process query 1622, see FIG. 25, is made to determine whether or not the novel process illustrated in FIG. 25 employs a delay time period before activating the DBD device. Such a delay period can include the time that is required for a gas to flow from gas discharging process 1610 to the DBD treatment device. The delay time is activated 1624 if such a delay is required. Upon completion 1626 of the delay time period, or when the process does not require a delay time period, a process inquiry 1628 is made to automatically determine if addition of a reactive gas, such as an oxidizing gas, is needed. The need for a reactive gas can be indicated for example through the processing gases/conditions that are used in process 1610, such as through information that is provided by a gas panel system for process 1610. If required, one or more reactive gases can be selected and introduced 1630 between process 1610 and the DBD treatment device, or directly into the reactor tube of the novel DBD device. For example if processing history or real time processing data show the presence of FCs, an appropriate computer program can provide instructions 1630 to select a reactive gas in a specific ratio to the gases that are to be treated in the DBD treatment device. If $O_2$ is the required gas, the gas flow preferred ratio of $O_2$ to FCs includes the following:

$O_2/CF_4$=1.2/1, $O_2/CHF_3$=1.2/1, $O_2/CH_2F_2$=1.2, $O_2/C_2F_6$=2.4, $O_2/C_4F_6$=4.8 and $O_2/C_4F_8$=4.8.

If the selected gas has been introduced 1630 at the required flow rate, or if the treatment does not require the addition of a reactive gas, an optional status check 1632 is made to determine if the status of the DBD treatment device is acceptable for starting the DBD process. If the status is not acceptable, the DBD device remains in, or is returned to, the standby mode 1612. If the status is deemed to be acceptable, the DBD device is activated to strike a plasma 1634 in the gas that is to processed. Preferably, the performance of the DBD treatment device and the composition of the gases that are discharged from the DBD device is monitored in step 1636. These gases can then be discharged 1638 to an additional gas treatment facility, such as a scrubber, for removal of noxious substances. It will be understood that some processing steps that are indicated in the flow chart shown in FIG. 25 can be executed in a sequence that is different from the sequence which is shown. Also, it will be understood that the invention is equally operable when the DBD treatment device is switched off rather than standby mode 1612, providing the device is fully activated upon the occurrence of the stated processing condition. As shown in FIG. 25, the DBD treatment device of the present invention operates on demand, based on processing conditions and interactions. Alternatively, it is contemplated to inject $N_2$ gas between gas discharging process 1610 and the DBD reactor in order to maintain the DBD plasma during interruptions of the gas flow from the gas discharging process. These interruptions can for example result from processing steps wherein a product such a wafer is moved into or out of a processing chamber.

Experiments were conducted wherein gas mixtures of $CH_4$ and $O_2$ were treated in a DBD treatment device of the present invention, using 7 cells, each having a nominal power of 350 W. In these experiments the DRE % was determined as shown in Table A, at different $CF_4$ and $O_2$ flow rates and at pressures ranging from 600 mT to 900 mT, and using methodologies for DRE determinations such as are well known to those of ordinary skill in the art.

TABLE A

| $CF_4$ Flow (sccm) | $O_2$ Flow (sccm) | Pressure (mT) | DRE (%) |
|---|---|---|---|
| 50 | 60 | 750 | 98.1 |
| 50 | 180 | 750 | 98.4 |
| 150 | 60 | 750 | 68.3 |
| 150 | 180 | 750 | 88.6 |
| 100 | 60 | 600 | 89.2 |
| 100 | 60 | 900 | 88.4 |
| 100 | 180 | 600 | 96.0 |
| 100 | 180 | 900 | 94.6 |
| 50 | 120 | 600 | 98.3 |
| 150 | 120 | 600 | 86.2 |
| 50 | 120 | 900 | 98.3 |
| 150 | 120 | 900 | 84.9 |
| 100 | 120 | 750 | 95.7 |
| 100 | 120 | 750 | 95.5 |
| 100 | 120 | 750 | 95.6 |

The results of Table A show that the DBD treatment device of the present invention is capable of achieving a high DRE percentage through optimization of the variables that are shown in this table.

In another series of experiments, novel DBD treatment devices having 6, 7 and 8 cells were evaluated at power levels ranging from 282 W to 367 W output. The resulting DRE percentages are shown in Table B, using $CF_4$ at a flow rate of 100 sccm cubic centimeter per minute) and $O_2$ at a flow rate of 150 sccm.

TABLE B

| Number of cells | Power Per cell (W) | DRE % |
| --- | --- | --- |
| 6 | 282 | 87.0 |
| 6 | 297 | 88.6 |
| 6 | 338 | 89.2 |
| 6 | 367 | 92.0 |
| 7 | 282.5 | 90.7 |
| 7 | 311 | 93.2 |
| 7 | 339 | 94.8 |
| 7 | 367 | 96.0 |
| 8 | 282 | 94.0 |
| 8 | 311 | 96.0 |
| 8 | 339 | 97.3 |
| 8 | 367 | 98.0 |

The results in Table B indicate that for a given flow rate, an increase in the number of cells results in a more significant DRE improvement than an increase in the power per cell.

Experimental results were obtained with a DBD treatment device having 7 cells, each cell having a nominal output of 350 W. Each cell was powered with a dedicated constant power DC power supply, providing AC power to the electrodes of the cells. A via etch of a semiconductor wafer was performed in a parallel plate plasma etch reactor using the parameters shown in Table C.

TABLE C

| | |
| --- | --- |
| $C_4F_6$ Flow (sccm) | 30 |
| $CHF_3$ Flow (sccm) | 80 |
| $O_2$ Flow (sccm) | 50 |
| Ar Flow (sccm) | 600 |
| Bias Power (W) | 3000 |
| Pressure (mT) | 80 |

Etching was continued during 3 minutes. Gases discharged from the etch reactor were pumped to the DBD treatment device, while introducing $O_2$ at a flow rate of 250 sccm. The composition of gases exiting from the DBD device was determined under the following three processing conditions: (1) etch reactor plasma and DBD plasma off, (2) etch reactor plasma on without striking a plasma in the DBD device and (3) etch reactor plasma on and DBD plasma on. The composition of the mixture of gases discharged from the DBD treatment device is shown in Table D, wherein the composition is expressed as total mg of mass for a duration of 3 minutes.

TABLE D

| | Etch & DBD off, Mass (mg) | Etch on, DBD off Mass (mg) | Etch & DBD on Mass (mg) |
| --- | --- | --- | --- |
| $C_4F_6$ | 0.55 | 0.052 | 0.0001 |
| $CF_4$ | | 0.28 | 0.015 |
| $CHF_3$ | 0.518 | 0.4 | 9E–04 |
| $C_2F_6$ | | 0.168 | 0.001 |
| $F_2$ | | 0.004 | 0.44 |
| $COF_2$ | | 0.071 | 0.353 |
| HF | | 0.021 | 0.062 |
| $SiF_4$ | | 0.026 | 0.049 |

TABLE D-continued

| | Etch & DBD off, Mass (mg) | Etch on, DBD off Mass (mg) | Etch & DBD on Mass (mg) |
| --- | --- | --- | --- |
| $CO_2$ | | 0.000 | 0.032 |
| CO | | 0.106 | 0.025 |

In Table D, $C_4F_6$ and $CHF_3$ are etch chemistry gases while the other gases listed in this table are formed as by-products of the etch reaction, or as reaction products of plasma treatment in the DBD treatment device. This experiment resulted in 98.52% DRE.

Figure 26:
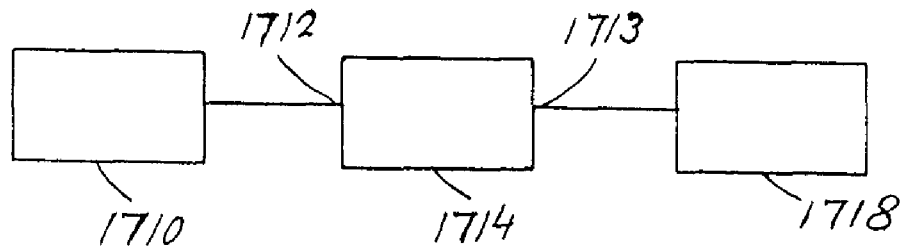
FIG. 26 is a schematic view showing a system of the present invention for generating active fluorine species.

In another embodiment of the present invention, schematically illustrated in FIG. 26, a novel technique for generating fluorine species for use in chemical processes is illustrated. A gas supply 1710 contains one or more gaseous fluorine compounds, such as $NF_3$, or a mixture of gases including one or more fluorine compounds. Gas from gas supply 1710 is introduced into a gas inlet 1712 of DBD device 1714 of the present invention. While flowing through the DBD device, the gas is subjected to plasma treatment, forming fluorine species such as fluorine atoms, ions and/or radicals. These species are discharged from DBD device 1714 through gas outlet 1716. The fluorine species thus generated can be used in a chemical processing method, technique or device 1718. Examples of processing device 1718 include wafer fabricating devices, such as etch chambers and vapor deposition chambers wherein the fluorine can be utilized to etch semiconductor devices or to clean the fabricating chambers. DBD device 1714 includes for example novel DBD cells 100, 200, 500 and 800, novel DBD reactors 900, 1010 and 1110 and novel DBD treatment devices 540, 1000 and 1100 as described in connection with FIGS. 6, 9, 14, 17, 18, 19 and 20 respectively. A suitable gas supply 1710 includes equipment such as gas supply containers, for example pressurized containers, and/or a gas control panel. The combination of novel DBD device 1714 and a chemical processing device 1718 forms a chemical processing system of the present invention. A semiconductor processing system of the present system is formed by the combination of novel DBD device 1714 and chemical processing equipment 1718 comprising a semiconductor or wafer manufacturing device.

The invention has been described in terms of the preferred embodiment. One skilled in the art will recognize that it would be possible to construct the elements of the present invention from a variety of means and to modify the placement of components in a variety of ways. While the embodiments of the invention have been described in detail and shown in the accompanying drawings, it will be evident that various additional modifications are possible without departing from the scope of the invention as set forth in the following claims.

We claim:
1. A method of treating a first gas, the method comprising:
   a) energizing a first dielectric barrier discharge (DBD) cell including: a substantially cylindrical dielectric tube having (1) an inside, (2) an outside surface, (3) a first electrically conductive electrode positioned on the outside surface of the tube and encircling the tube, and (4) a second electrically conductive electrode positioned on the outside surface of the tube and encircling the tube, wherein (i) the second electrode is positioned a distance D from the first electrode and (ii) the first and second electrodes are placed in a side-by-side position;
   b) flowing the first gas through the inside of the tube; and c) generating a first plasma in the first gas through dielectric barrier discharge inside the tube, wherein a first treated gas is formed.

2. The method of claim 1 wherein the distance D ranges from about 10 mm to about 30 mm.

3. The method of claim 1 wherein the first and second electrodes comprise shapes selected from the group consisting of rings and cylindrical bands.

4. The method of claim 1 wherein the first and second electrodes include heat exchange elements.

5. The method of claim 1 wherein the first gas comprises one or more gases selected from the group of gases consisting of fluorocarbon gas, $NF_3$, mixtures of fluorocarbon gas and inert gas, and mixtures of $NF_3$ and inert gas.

6. The method of claim 1 wherein the first gas comprises one or more gases that are discharged from a semiconductor fabricating device.

7. The method of claim 1 wherein the first gas comprises one or more gases that are discharged from a chemical processing device.

8. The method of claim 1 additionally comprising adding a second gas to the first gas, such that the first and second gases form a gaseous mixture.

9. The method of claim 8 wherein the second gas comprises a gas that is capable of reacting with the first gas, when the first plasma is generated in the tube.

10. The method of claim 8 wherein the second gas is added before the first gas flows through the first cell.

11. The method of claim 10 wherein the gaseous mixture is pre-treated prior to flowing the gaseous mixture through the first cell.

12. The method of claim 8 additionally comprising analyzing the composition of the first treated gas.

13. The method of claim 8 wherein the second gas is added to the first gas between the first electrode and the second electrode.

14. The method of claim 1 additionally comprising analyzing the gas composition of the first treated gas.

15. The method of claim 1 wherein energizing the first cell comprises activating a first AC power supply.

16. The method of claim 15 wherein activating the first power supply comprises controlling the first power supply employing one or more techniques selected from the group consisting of analyzing the first treated gas, determining gas pressure inside the tube and determining tube temperature.

17. The method of claim 15 wherein the first power supply comprises a switched mode resonant high voltage power supply.

18. The method of claim 15 wherein the first power supply comprises:

a) a DC power supply;

b) a capacitor in parallel with the DC power supply; and c) electrical components connected in series including: (1) an inductor, (2) a primary winding of a transformer and (3) a MOSFET switch having a snubber capacitor in parallel with the switch and wherein the series is in parallel with the DC power supply.

19. The method of claim 1 additionally comprising:

a) energizing a second DBD cell including (1) the tube, (2) a third electrically conductive electrode positioned on the outside surface of the tube and encircling the tube and (3) a fourth electrically conductive electrode positioned on the outside of the tube, wherein the third and fourth electrodes are in a side-by-side position;

b) flowing the first treated gas through the inside of the tube positioned at the second DBD cell;

c) generating a second plasma in the first treated gas through dielectric barrier discharge inside the second cell, wherein a second treated gas is formed.

20. The method of claim 19 wherein energizing the second cell comprises activating a second AC power supply.

21. The method of claim 20 wherein the first and second AC power supplies are controlled independently.

22. The method of claim 19 wherein the first and second DBD cells are energized independently of each other.

23. The method of claim 19 additionally comprising analyzing a composition of the first treated gas prior to introducing the first treated gas into the second DBD cell, thereby obtaining first analytical results.

24. The method of claim 23 wherein generating the second plasma comprises controlling the second plasma employing the analytical results.

25. The method of claim 24, additionally comprising introducing a third gas between the first and second cells.

26. The method of claim 1 additionally comprising:

a) flowing the first gas through a first vacuum pumping stage before flowing the gas through the tube; and b) flowing the first treated gas through a second vacuum pumping stage, wherein the first and second pumping stages are integrated with the first cell.

* * * * *